(12) United States Patent
Li et al.

(10) Patent No.: US 8,114,768 B2
(45) Date of Patent: Feb. 14, 2012

(54) ELECTROMIGRATION RESISTANT VIA-TO-LINE INTERCONNECT

(75) Inventors: Baozhen Li, South Burlington, NY (US); Paul S. McLaughlin, Poughkeepsie, NY (US); Timothy D. Sullivan, Underhill, NY (US)

(73) Assignee: International Business Machines Corporation, Armonk, NY (US)

( * ) Notice: Subject to any disclaimer, the term of this patent is extended or adjusted under 35 U.S.C. 154(b) by 293 days.

(21) Appl. No.: 12/344,838

(22) Filed: Dec. 29, 2008

(65) Prior Publication Data

US 2010/0164116 A1    Jul. 1, 2010

(51) Int. Cl.
*H01L 21/4763* (2006.01)
(52) U.S. Cl. ............... 438/629; 257/E21.592
(58) Field of Classification Search ........... 257/E21.597; 438/622, 629, 637–639, 667–668
See application file for complete search history.

(56) References Cited

U.S. PATENT DOCUMENTS 5,689,134 A * 11/1997 Pasch et al. ............ 257/659
6,100,195 A *  8/2000 Chan et al. ............ 438/687
2005/0019616 A1  1/2005 Foltyn et al.
2006/0115964 A1  6/2006 Findikoglu et al.
2006/0142164 A1  6/2006 Foltyn et al.
2007/0111510 A1  5/2007 Agarwala et al.
2007/0158851 A1  7/2007 Chanda et al.

FOREIGN PATENT DOCUMENTS

KR  10-2008-0104793 A  12/2008

OTHER PUBLICATIONS

Letter from IBM Korea which indicates that the date of the issued Office Action is Apr. 28, 2011.

* cited by examiner

*Primary Examiner* — Hoa B Trinh
(74) *Attorney, Agent, or Firm* — Scully, Scott, Murphy & Presser, P.; Richard M. Kotulak, Esq.

(57) ABSTRACT

A liner-to-liner direct contact is formed between an upper metallic liner of a conductive via and a lower metallic liner of a metal line below. The liner-to-liner contact impedes abrupt electromigration failures and enhances electromigration resistance of the metal interconnect structure. The at least one dielectric material portion may include a plurality of dielectric material portions arranged to insure direct contact of between the upper metallic liner and the lower metallic liner. Alternatively, the at least one dielectric material portion may comprise a single dielectric portion of which the area has a sufficient lateral overlap with the area of the conductive via to insure that a liner-to-liner direct contact is formed within the range of allowed lithographic overlay variations.

20 Claims, 16 Drawing Sheets

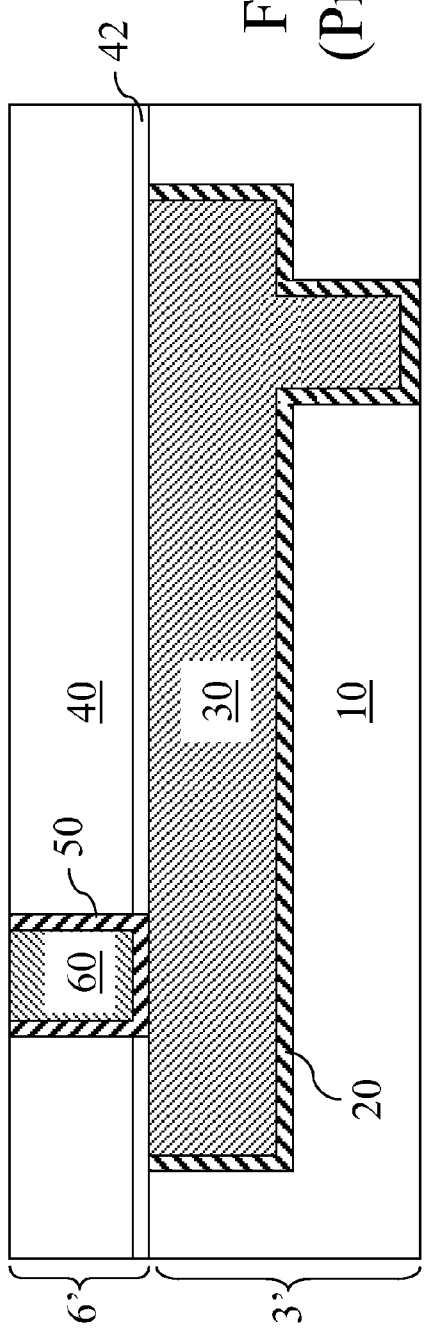
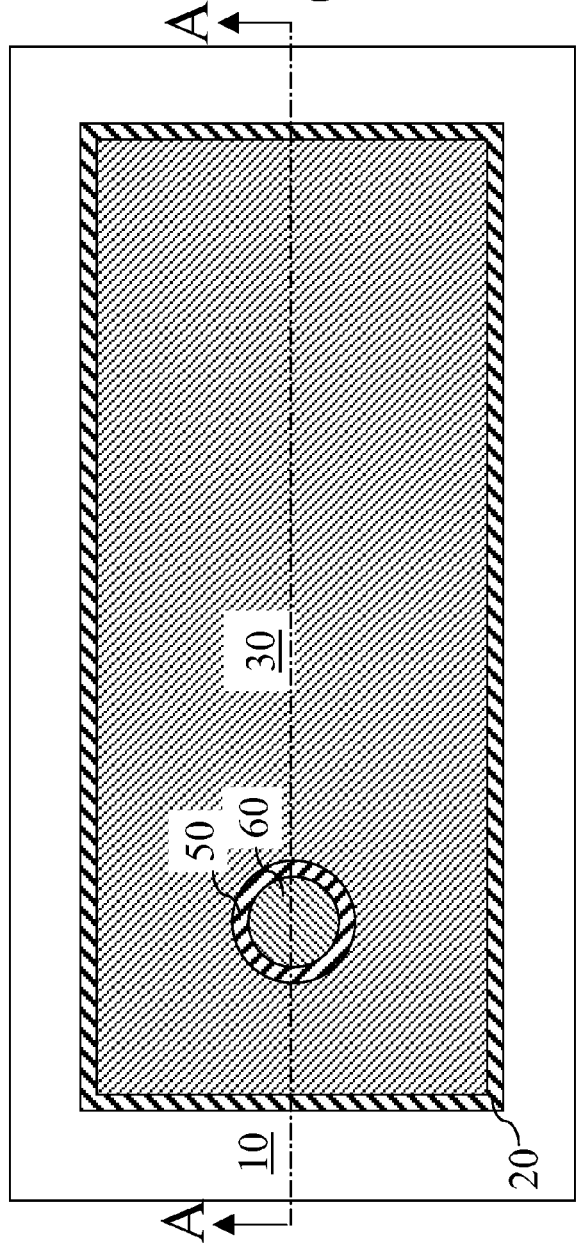
FIG. 1A (Prior Art)
FIG. 1B (Prior Art)

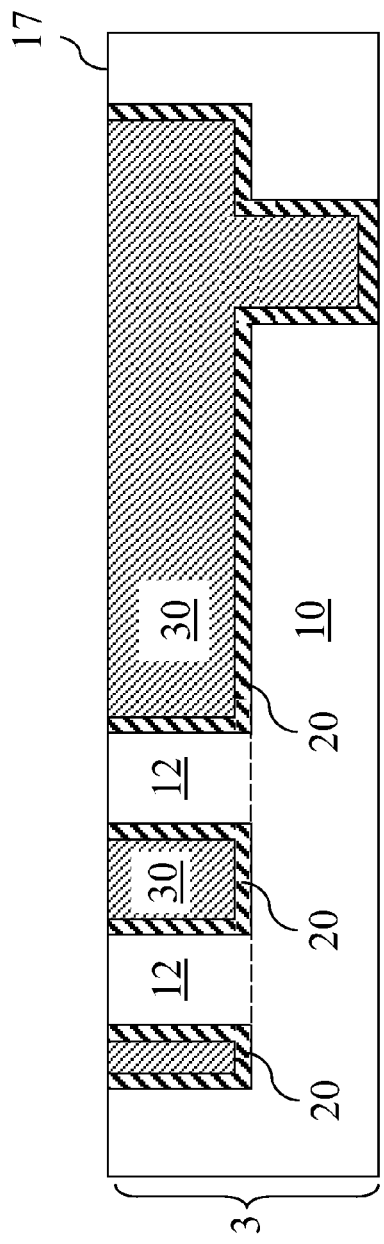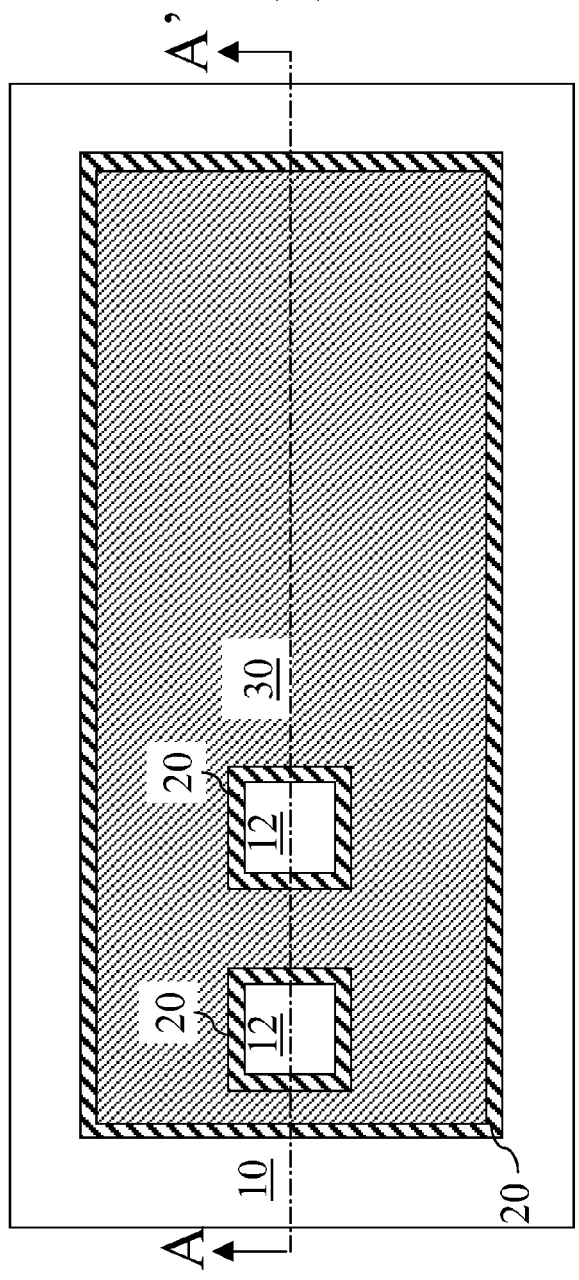

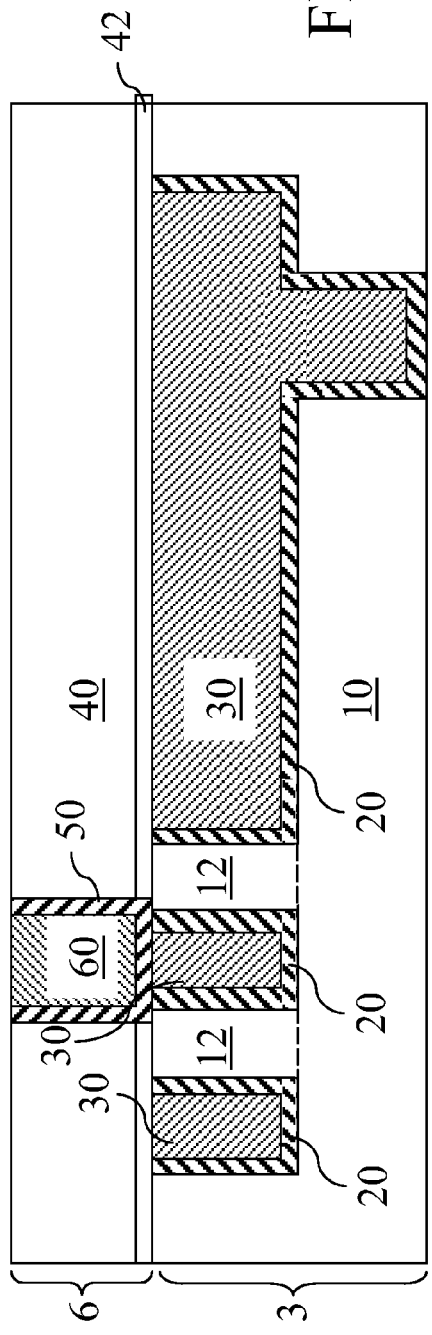
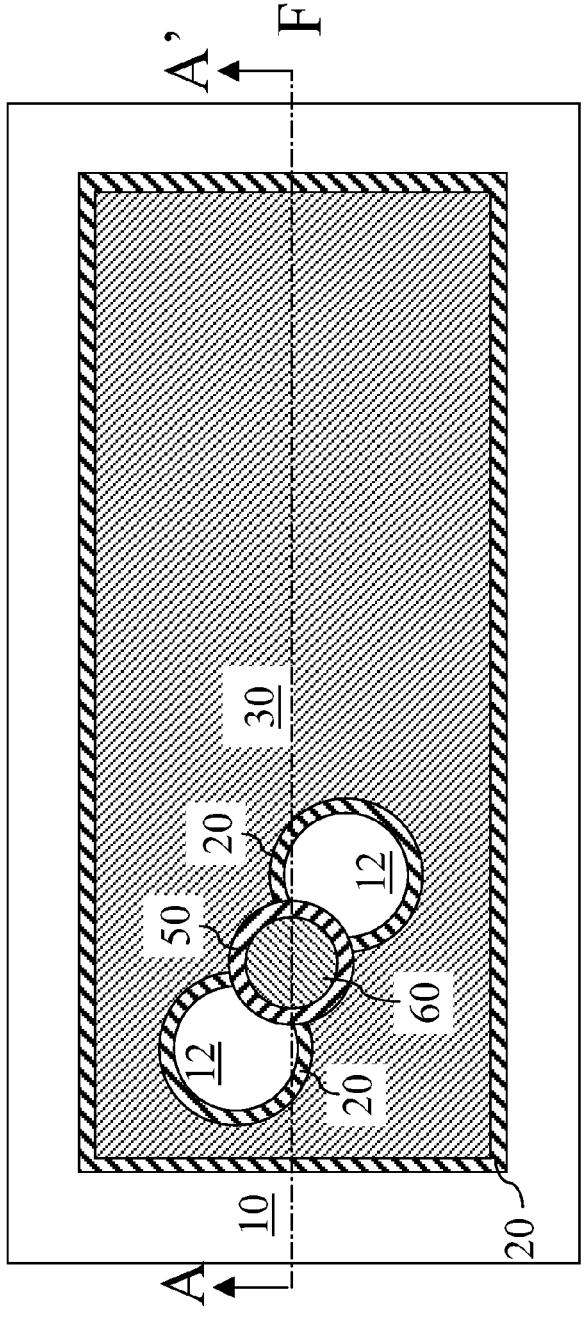
FIG. 11A
FIG. 11B

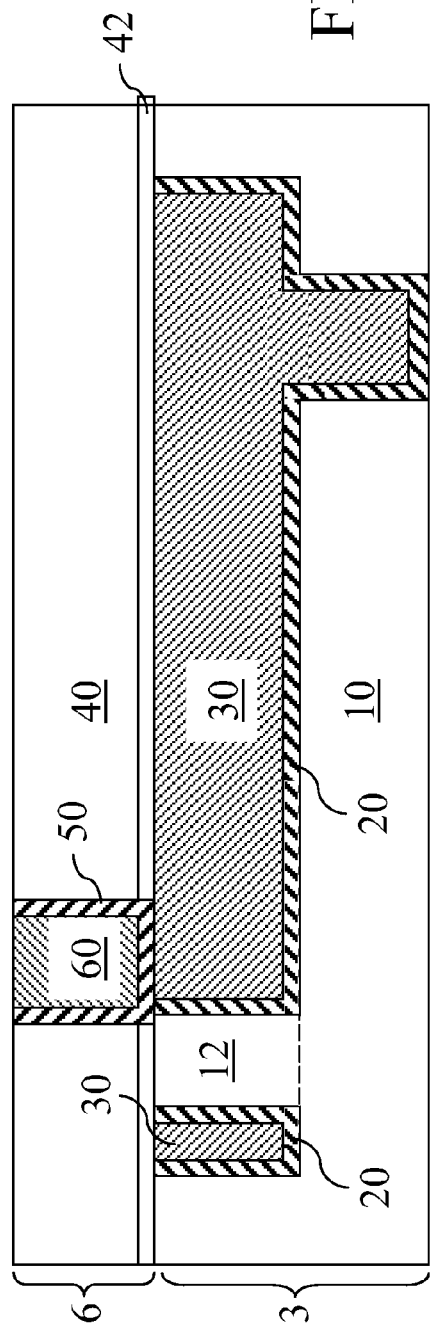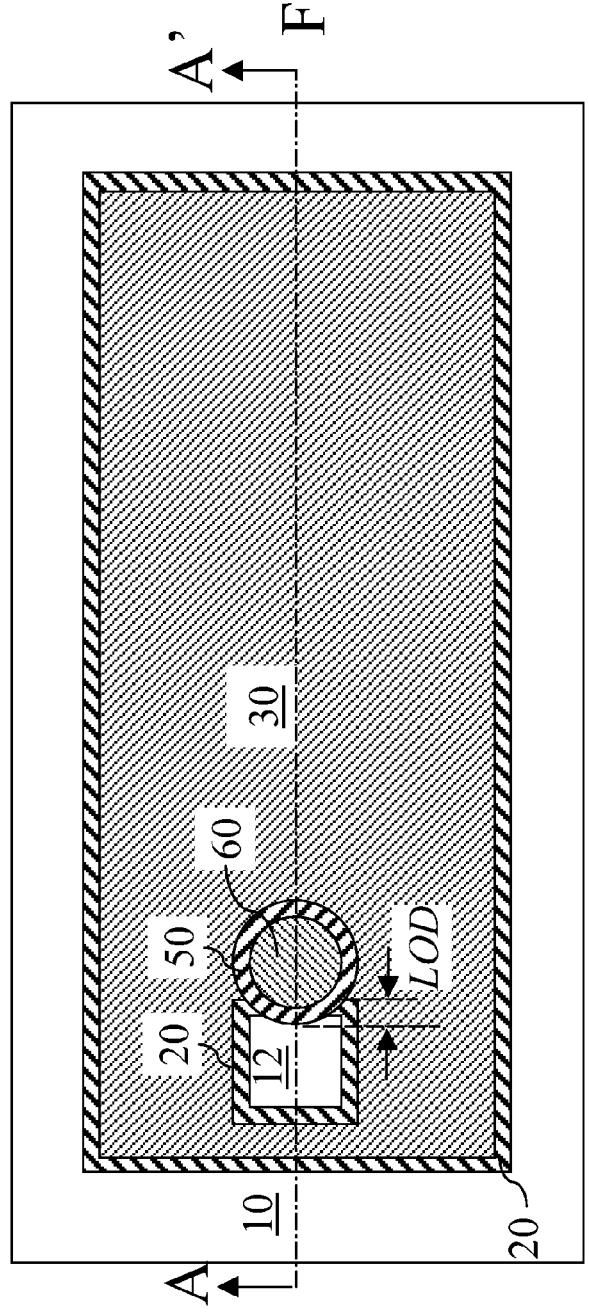

ELECTROMIGRATION RESISTANT VIA-TO-LINE INTERCONNECT

FIELD OF THE INVENTION

The present invention relates to metal interconnect structures, and particularly to electromigration resistant metal interconnect structures including a metal line and a conductive via, and methods of manufacturing the same.

BACKGROUND OF THE INVENTION

A metal line comprises a lattice of metal ions and non-localized free electrons. The metal ions are formed from metal atoms that donate some of their electrons to a common conduction band of the lattice, and the non-localized free electrons move with relatively small resistance within the lattice under an electric field. Normal metal lines, excluding superconducting materials at or below a superconducting temperature, have finite conductivity, which is caused by interaction of electrons with crystalline imperfections and phonons which are thermally induced lattice vibrations.

When electrical current flows in the metal line, the metal ions are subjected to an electrostatic force due to the charge of the metal ion and the electric field to which the metal ion is exposed to. Further, as electrons scatter off the lattice during conduction of electrical current, the electrons transfer momentum to the metal ions in the lattice of the conductor material. The direction of the electrostatic force is in the direction of the electric field, i.e., in the direction of the current, and the direction of the force due to the momentum transfer of the electrons is in the direction of the flow of the electrons, i.e., in the opposite direction of the current. However, the force due to the momentum transfer of the electrons is generally greater than the electrostatic force. Thus, metal ions are subjected to a net force in the opposite direction of the current, or in the direction of the flow of the electrons.

High defect density, i.e., smaller grain size of the metal, or high temperature typically increases electron scattering, and consequently, the amount of momentum transfer from the electrons to the conductor material. Such momentum transfer, if performed sufficiently cumulatively, may cause the metal ions to dislodge from the lattice and move physically. The mass transport caused by the electrical current, or the movement of the conductive material due to electrical current, is termed electromigration in the art.

In applications where high direct current densities are used, such as in metal interconnects of semiconductor devices, electromigration causes a void in a metal line or in a metal via. Such a void results in a locally increased resistance in the metal interconnect, or even an outright circuit "open." In this case, the metal line or the metal via no longer provides a conductive path in the metal interconnect. Formation of voids in the metal line or the metal via can thus result in a product failure in semiconductor devices.

FIGS. 1A and 1B show an exemplary prior art metal interconnect structure comprising a lower level metal interconnect structure 3' and an upper level metal interconnect structure 6'. FIG. 1A is a vertical cross-sectional view of the exemplary prior art metal interconnect structure, and FIG. 1B is a modified top-down view in which an upper dielectric material layer 40 and an optional dielectric cap layer 42 are removed from a top-down view for clarity.

The lower level metal interconnect structure 3' comprises a lower dielectric material layer 10 embedding a lower conductive structure, which includes a lower metallic liner 20 and a line-level metal portion 30. The lower metallic liner 20 and the line-level metal portion 30 collective form at least a metal line. Depending on whether a dual damascene integration scheme is employed or a single damascene integration scheme is employed to form the lower level metal interconnect structure 3', the lower metallic liner 20 and the line-level metal portion 30 may constitute the metal line and at least one integrated via extending downward, or may constitute only the metal line without any via extending downward. The lower metallic liner 20 is formed on recessed surfaces of the lower dielectric material layer 10, i.e., surfaces below the level of the interface between the lower dielectric material layer 10 and the upper level metal interconnect structure 6'. The line-level metal portion 30 comprises a metal such as copper, and is formed directly on, and the inside of, the lower metallic liner 20. The top surfaces of the lower metallic liner 20 and the line-level metal portion 30 are substantially coplanar with the top surface of the lower dielectric material layer 10, i.e., the interface between the lower level metal interconnect structure 3' and the upper level metal interconnect structure 6' is substantially planar and level without any protrusions. Such geometry results from interlevel planarization process that is routinely used in semiconductor manufacturing.

The upper level metal interconnect structure 6' comprises the upper dielectric material layer 40 and the optional dielectric cap layer 42 embedding an upper conductive structure, which includes an upper metallic liner 50 and a via-level metal portion 60. The upper metallic liner 50 and the via-level metal portion 60 collective form at least a conductive via. Depending on whether a dual damascene integration scheme is employed or a single damascene integration scheme is employed to form the upper level metal interconnect structure 6', the upper metallic liner 50 and the via-level metal portion 60 may constitute the conductive via and a metal line integrally formed with the conductive via 60, or may constitute only the conductive via without any integrally formed metal line. The upper metallic liner 50 is formed on recessed surfaces of the upper dielectric material layer 50, i.e., surfaces below the topmost surface of the upper level metal interconnect structure 6'. The via-level metal portion 60 comprises a metal such as copper, and is formed directly on, and inside of, the upper metallic liner 60.

A salient feature of the exemplary prior art metal interconnect structure is that the entirety of the interface between the conductive via (50, 60) and the metal line (20, 30) consists of a contact between the upper metallic liner 50 and the line-level metal portion 30. The upper metallic liner 50 does not abut the lower dielectric material layer 10. Further, the layout of the conductive via (50, 60) and the metal line (20, 30) is designed to avoid direct contact between the upper metallic liner 50 and the lower metallic liner 20. This is often effected by providing enough distance, i.e., a distance that exceeds lithographic overlay variations, between the projected location of the perimeter of the upper metallic liner 50 and projected location of the perimeter of the lower metallic liner 20. The primary purpose of such designs employed for the exemplary prior art metal interconnect structure is to maximize the contact area between the upper metallic liner 50 and the line-level metal portion 30 so that the resistance at the interface between the conductive via (50, 60) and the metal line (20, 30) is minimized, thereby suppressing temperature elevation during usage and preventing electromigration, which accelerates at elevated temperatures.

FIG. 2 is a graph showing data for resistance shift in time for a group of physical interconnect structures manufactured and tested during the course of research leading to the present invention by employing the exemplary prior art metal interconnect structure of FIGS. 1A and 1B. For this test, a copper line having a width of about 0.4 micron was subjected to a current density of about 25 mA/$\mu m^2$ at the interface between a conductive via (50, 60; See FIGS. 1A and 1B) and a metal line (20, 30: See FIGS. 1A and 1B) at an elevated temperature of 300° C. The resistance of each physical interconnect structure was monitored and plotted as a function of time in FIG. 2, which shows clustered failures around 25 hours. The resistance of the physical interconnect structures increase abruptly around 25 hours with electromigration failure as voids form at the interface between the conductive via (50, 60) and the metal line (20, 30).

In view of the above, there exists a need to provide a metal interconnect structure between a metal line and a conductive via that provides enhanced electromigration resistance, and methods of providing the same.

SUMMARY OF THE INVENTION

The present invention provides metal interconnect structures including a metal line and a metal via and having a higher resistance to electromigration compared to prior art structures, and methods of manufacturing such electromigration resistant metal interconnect structures.

In the present invention, a lower level metal interconnect structure comprises a lower dielectric material layer and a metal line including a lower metallic liner and a line-level metal portion. An upper level metal interconnect structure, comprising an upper dielectric material layer and a conductive via including an upper metallic liner and a via-level metal portion, is formed directly on the lower metal interconnect level. The lower level metal interconnect structure includes at least one dielectric material portion directly contacting and underlying the upper metallic liner. A portion of the lower metallic liner, which is formed on the sidewalls of the at least one dielectric material portion, vertically abuts a portion of the upper metallic liner.

A liner-to-liner direct contact is formed between the upper metallic liner and the lower metallic liner, which impedes abrupt electromigration failures and enhances electromigration resistance of the metal interconnect structure. The at least one dielectric material portion may include a plurality of dielectric material portions arranged to insure direct contact of between the upper metallic liner and the lower metallic liner. Alternatively, the at least one dielectric material portion may comprise a single dielectric portion of which the area has a sufficient lateral overlap with the area of the conductive via to insure that a liner-to-liner direct contact is formed within the range of allowed lithographic overlay variations. Since the materials of the upper metallic liner and the lower metallic liner have much greater electromigration resistance, the liner-to-liner direct contact has high electromigration resistance and the electrical contact through the liner-to-liner direct contact is maintained even when the interface between the upper metallic liner and the line-level metal portion develops voids, thereby providing enhanced lifetime for the metal interconnect structure.

According to an embodiment of the present invention, a metal interconnect structure is provided, which comprises:

a lower level metal interconnect structure comprising a lower dielectric material layer and a metal line embedded therein and including a lower metallic liner and a line-level metal portion;

an upper level metal interconnect structure vertically abutting the lower level metal interconnect structure and comprising an upper dielectric material layer and a conductive via including an upper metallic liner and a via-level metal portion, wherein the lower metallic liner directly contacts the upper metallic liner.

In one embodiment, the metal interconnect structure further comprises at least one dielectric material portion of integral construction with the lower dielectric material layer and laterally abutted and surrounded by the lower metallic liner, wherein the portion of the lower metallic liner is laterally abutted and surrounded by the line-level metal portion and vertically abuts the upper metallic liner.

In another embodiment, the metal interconnect structure further comprises at least one dielectric material portion of integral construction with, and laterally abuts, the lower dielectric material layer, wherein a sidewall of the lower metallic liner is laterally recessed away from the lower dielectric material layer toward the conductive via, and wherein a portion of the lower metallic liner laterally abuts the at least one dielectric material portion and vertically abuts the upper metallic liner.

In yet another embodiment, the metal interconnect structure further comprises a plurality of dielectric material portions of integral construction with, and vertically abutting, the lower dielectric material layer, wherein at least one portion of the lower metallic liner laterally abuts one of the plurality of dielectric material portions and vertically abuts the upper metallic liner.

According to another embodiment of the present invention, a method of manufacturing a metal interconnect structure is provided, which comprises:

forming a line trench and at least one dielectric material portion by vertically recessing a patterned area of a lower dielectric material layer, and wherein sidewalls of the at least one dielectric material portion laterally surround the at least one dielectric material portion or a sidewall of the at least one dielectric material portion laterally protrudes into the line trench;

forming a metal line including a lower metal liner and a line-level metal portion in the line trench;

forming an upper dielectric material layer on the metal line; and forming a conductive via in the upper dielectric material layer, wherein the lower metallic liner directly contacts the upper metallic liner.

In one embodiment, the at least one dielectric material portion is of integral construction with, and vertically abuts, the lower dielectric material layer, wherein a portion of the lower metallic liner laterally abuts and surrounds the at least one dielectric material portion, wherein the portion of the lower metallic liner is laterally abutted and surrounded by the line-level metal portion and vertically abuts the upper metallic liner.

In another embodiment, the at least one dielectric material portion is of integral construction with, and laterally abuts, the lower dielectric material layer, wherein a sidewall of the lower metallic liner is laterally recessed away from the lower dielectric material layer toward the conductive via, and wherein a portion of the lower metallic liner laterally abuts the at least one dielectric material portion and vertically abuts the upper metallic liner.

In yet another embodiment, the at least one dielectric material portion comprises a plurality of dielectric material portions of integral construction with, and vertically abutting, the lower dielectric material layer, wherein at least one portion of the lower metallic liner laterally abuts one of the plurality of dielectric material portions and vertically abuts the upper metallic liner.

BRIEF DESCRIPTION OF THE DRAWINGS

FIGS. 1A and 1B are views of an exemplary prior art metal interconnect structure. FIG. 1A is a vertical cross-sectional view along the plane A-A' in FIG. 1B. FIG. 1B is a modified top-down view in which an upper dielectric material layer 40 and an optional dielectric cap layer 42 are removed from a top-down view for clarity.

FIGS. 3A, 3B, 4A, 4B, 5A, 5B, 6A, and 6B are sequential vertical cross-sectional views of a first exemplary metal interconnect structure according to a first embodiment of the present invention. Figures with the same numeric label correspond to the same stage of manufacturing. Figures with the suffix "A" are vertical cross-sectional views along the plane A-A' of the corresponding figure with the same numeric label and the suffix "B." FIGS. 3B, 4B, and 5B are top-down views. FIG. 6B is a modified top-down view in which an upper dielectric material layer 40 and an optional dielectric cap layer 42 are removed from a top-down view for clarity.

FIGS. 11A, 12A, 13A, 14A, 15A, and 16A are vertical cross-sectional views of fourth through ninth exemplary metal interconnect structures, respectively, along the plane A-A' of the corresponding figure with the same numeric label and the suffix "B" according to third through eighth embodiments, respectively, of the present invention. FIGS. 11B, 12B, 13B, 14B, 15B, and 16B are modified top-down views of the fourth through ninth exemplary metal interconnect structures, respectively, in which an upper dielectric material layer 40 and an optional dielectric cap layer 42 are removed from a top-down view for clarity.

DETAILED DESCRIPTION OF THE INVENTION

Figure 2:
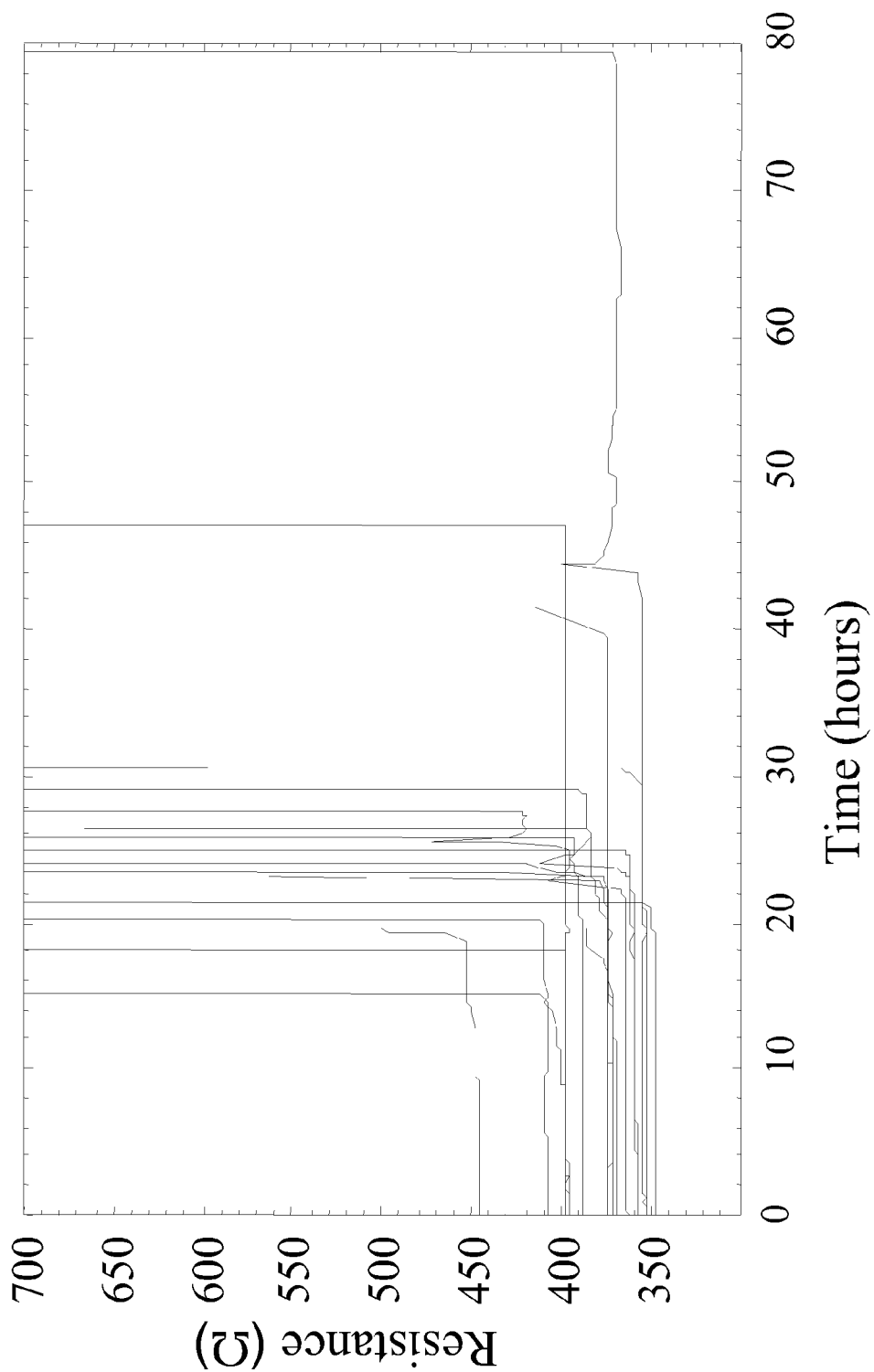
FIG. 2 is a graph showing data for resistance shift in time for a group of physical interconnect structures employing the exemplary prior art metal interconnect structure of FIGS. 1A and 1B.

As stated above, the present invention relates to electromigration resistant metal interconnect structures including a metal line and a conductive via, which are described herein with accompanying figures. As used herein, when introducing elements of the present invention or the preferred embodiments thereof, the articles "a", "an", "the" and "said" are intended to mean that there are one or more of the elements. Throughout the drawings, the same reference numerals or letters are used to designate like or equivalent elements. Detailed descriptions of known functions and constructions unnecessarily obscuring the subject matter of the present invention have been omitted for clarity. The drawings are not necessarily drawn to scale.

As used herein, a structural element is referred to as being "on" another structural element when the structural element is located directly on the other structural element or when a set of at least one intervening element making direct physical contact with the structural element and the other structural element is present. A structural element is referred to as being "directly on" another structural element when there is no intervening structural element and a physical contact is formed between the structural element and the other structural element Likewise, an element is referred to as being "connected" or "coupled" to another element when the element is directly connected or coupled to the other element or when a set of at least one intervening element provides connection or coupling with the element and the other element. An element is referred to as being "directly connected" or "directly coupled" to another element when there is no intervening element and the connection or coupling is provided between the element and the other element. An element "abuts" another element when a physical interface area providing a direct contact is present between the element and the other element.

Figure 3A:
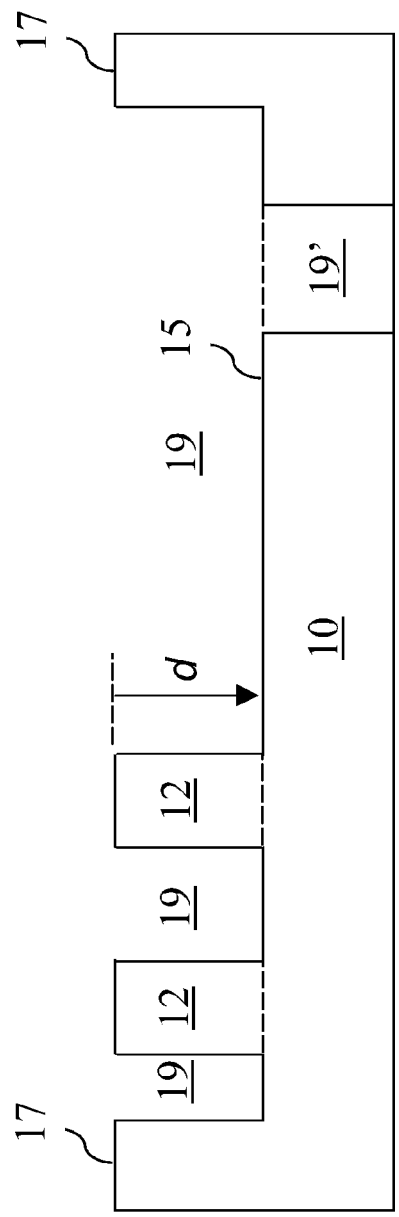
Figure 3B:
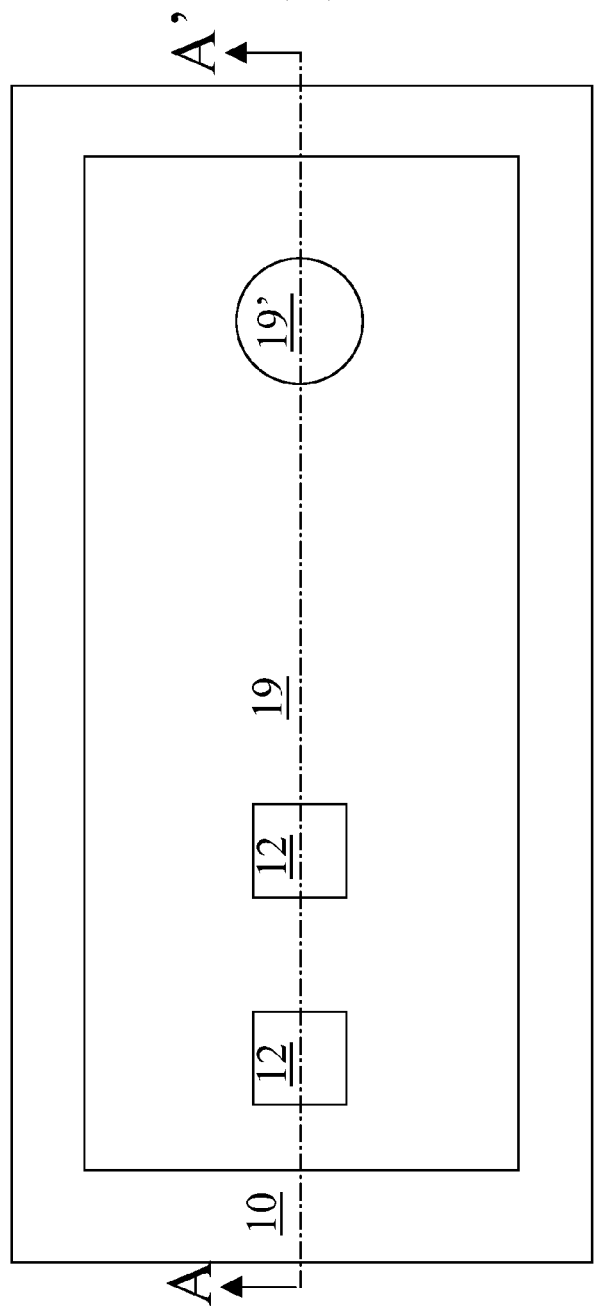

Referring to FIGS. 3A and 3B, a first exemplary metal interconnect structure according to a first embodiment of the present invention comprises a lower dielectric material layer 10 containing a line trench 19, which is a trench formed in the shape of a metal line to be subsequently formed for providing a horizontal electrically conductive path. The line trench 19 may be formed integrally with at least one via cavity 19' directly connected to a recessed surface 15 of the line trench 19, which is formed below a topmost surface 17 of the lower dielectric material layer 10. A boundary between the line trench 19 and the at least one via cavity 19 is represented by a dotted line in FIG. 3A. A semiconductor substrate (not shown) including at least one semiconductor device may be located beneath the lower dielectric material layer 10. The semiconductor substrate may abut the bottom surface of the lower dielectric material layer 10, or at least one intervening metal interconnect structure (not shown) including at least one intervening dielectric material layer embedding at least one metal wiring structure may be present between the bottom surface of the lower dielectric material layer 10 and the semiconductor substrate.

At least one dielectric material portion 12 is formed within the outer perimeter of the line trench 19. The at least one dielectric material portion 12 may be a plurality of dielectric material portions. The outer perimeter of the line trench 19 may have a substantially rectangular shape, any polygonal shape, any elliptical shape, any curvilinear closed shape, or a combination thereof so that the outer perimeter as seen from a top-down view such as FIG. 3B has a closed shape. The at least one via cavity 19' is optional, and may be formed if a dual damascene method is employed in which a metal line is formed integrally with an underlying conductive via. If a single damascene method is employed, a top surface of at least one conductive via filled with a conductive material may be exposed at the recessed surface 15 of the line trench 19 instead. While the present invention is described with exemplary metal interconnect structures formed with a dual damascene method, the present invention may also be practiced with a lower dielectric material layer 10 formed with a single damascene method, and such variations are explicitly contemplated herein.

The lower dielectric material layer 10 may comprise an oxide based conventional dielectric material, which has a dielectric constant k from about 3.6 to about 3.9, or a low-k dielectric material, which has a dielectric constant k of about 3.0 or less, preferably less than about 2.8, and more preferably less than about 2.5. Non-limiting examples of the oxide based conventional dielectric material included undoped silicate glass (USG), fluorosilicate glass (FSG), borophosphosilicate glass (BPSG), and phosphosilicate glass (PSG). The low-k dielectric material may be a spin-on low-k dielectric material or a CVD low-k dielectric material, i.e., a low-k dielectric material deposited by chemical vapor deposition (CVD). An example of the spin-on low-k dielectric material is a thermosetting polyarylene ether, which is also commonly referred to as "Silicon Low-K", or "SiLK™." The term "polyarylene" herein denotes aryl moieties or inertly substituted aryl moieties which are linked together by bonds, fused rings, or inert linking groups such as oxygen, sulfur, sulfone, sulfoxide, carbonyl, etc. Composition and deposition methods of the CVD low-k dielectric material are well known in the art. For example, the CVD low-k dielectric material may be a SiCOH dielectric containing a matrix of a hydrogenated oxidized silicon carbon material (SiCOH) comprising atoms of Si, C, 0 and H in a covalently bonded tri-dimensional network. Both the spin-on low-k dielectric material and the CVD low-k dielectric material may be porous, which decreases the dielectric constant of the lower dielectric material layer 10. The lower dielectric material layer 10 may comprise a stack of at least two of the oxide based conventional dielectric material, the spin-on low-k dielectric material, and the CVD low-k dielectric material.

The thickness of the lower dielectric material layer 10 may be from 50 nm to about 2 μm, and typically from 100 to about 500 nm, although lesser and greater thicknesses are explicitly contemplated herein. The depth d of the line trench 19 may be from about 20% to 80%, and typically from about 35% to about 65%, of the thickness of the lower dielectric material layer 10 if a dual damascene method is employed, although lesser and greater percentages are explicitly contemplated herein. In case a single damascene method is employed, the lower dielectric material layer 10 comprises a stack of a first dielectric material layer having a thickness of about the height of at least one conductive via (not shown), which replaces the at least one via cavity 19', and a second dielectric material layer having a thickness of about the depth d of the line trench 19.

The line trench 19 is formed by lithographic methods and an anisotropic etch. For example, a photoresist may be applied over a blanket film of the lower dielectric material layer 10 without any pattern and having a top surface at the level of the topmost surface 17 of the lower dielectric material layer 10. The photoresist is lithographically patterned, and the pattern in the photoresist is transferred into the blanket film of the lower dielectric material layer 10 by vertically recessing exposed portions, which is the patterned area, of the top surface of the lower dielectric material layer 10 to form the lower dielectric material layer 10 as shown in the FIGS. 3A and 3B. An anisotropic etch such as a reactive ion etch is employed to recess the exposed surfaces to the level of the recessed surface 15 of the line trench 19. The photoresist is subsequently removed selective to the lower dielectric material layer 10. In a dual damascene method, the at least one via cavity 19' may be formed by employing another lithography step and another anisotropic etch prior to, or after, the formation of the line trench 19 as known in the art.

The sidewalls of the line trench 19 may be substantially vertical, or may have an inward taper so that the recessed surface 15 of the line trench 19 is narrower than the opening at the topmost surface 17 of the line trench 19. The taper angle may be from 0 degree to about 30 degrees, and typically from about 1 degrees to about 15 degrees, depending on the material of the lower dielectric material layer 10, the width of the opening at the topmost surface 17 of the line trench 19, the etch chemistry employed in etching the line trench 19, and the depth d of the line trench 19.

The horizontal cross-sectional area of each of the at least one dielectric material portion 12 may have any closed shape including a square, a rectangle, a circle, an ellipse, a curvilinear closed shape, a close shape including a polygonally segmented portion and a curved portion, or any combination thereof. Typically, each of the at least one dielectric material portion 12 has a cross-sectional shape of a circle, an ellipse, a rectangle, or a substantial rectangle having rounded corners. In case the at least one dielectric material portion 12 is a plurality of dielectric material portions, each of the plurality of dielectric material portions may be arranged around, and with spaces thereamongst encircle, an area over which a conductive via is subsequently formed.

The sidewalls of the at least one dielectric material portion 12 laterally surround each of the at least one dielectric material portion 12. The top surface of each of the at least one dielectric material portion 12 is substantially coplanar with, i.e., located at substantially the same level as, the topmost surface 17 of the line trench 19. Each of the at least one dielectric material portion 12 is of integral construction with the lower dielectric material layer 10. The lower dielectric material layer and the at least one dielectric material portion 12 have the same composition. Each of the at least one dielectric material portion 12 vertically abuts the lower dielectric material layer 10. Sidewalls of the at least one dielectric material portion 12 constitute a portion of sidewalls of the line trench 19. The horizontal boundaries between the at least one dielectric material layer 12 and the lower dielectric material layer 10 are marked with dotted lines in FIG. 3A.

Referring to FIGS. 4A and 4B, a lower metallic liner 20 is deposited on the sidewalls and the bottom surface of the line trench 19 by physical vapor deposition (PVD), i.e., sputtering, chemical vapor deposition (CVD), electroplating, electroless plating, or a combination thereof. Thus, the lower metallic liner 20 abuts the sidewalls and the bottom surface of the line trench 19. The lower metallic liner 20 comprises an elemental metal or a metallic compound that provides good adhesion to the lower dielectric material layer 10 and serves as a barrier for mobile ions and contaminants to protect the metal line 30, and prevents diffusion of the material of the metal line 30 into the lower dielectric material layer 10. For example, the lower metallic liner 20 may comprise conductive metal nitride, Ti, Ta, and CoWP. Non-limiting examples of conductive nitride include TiN, TaN, and WN. CoWP is a compound of Co, W, and P that is formed by electroplating or electroless plating and contains from about 5 atomic percent to about 30 atomic percent P, the balance being a mixture of Co an W. The material of the lower metallic liner 20 provides higher electromigration resistance than the material to be subsequently employed for a metal layer, from which a line-level metal portion is formed.

The lower metallic liner 20 may have the same, or different, thickness between a bottom portion that vertically abut the lower dielectric material layer 10, and sidewall portions that substantially laterally abut the lower dielectric material layer 10. The thickness of the bottom portion of the lower metallic liner 20 is herein referred to as the thickness of the lower metallic liner 20. The thickness of the lower metallic liner 20 may be from about 3 nm to about 60 nm, and typically from about 10 nm to about 30 nm, although lesser and greater thicknesses are explicitly contemplated herein. The ratio between the thickness of the sidewall portions of the lower metallic liner 20 to the thickness of the bottom portion of the lower metallic liner 20, i.e., the "thickness of the metal liner" 20, is referred to as step coverage. The step coverage is dependent on the method of deposition of the lower metallic liner 20, the taper angle of the sidewalls of the line trench, and the aspect ratio of the line trench 19, i.e., the ratio of the height to the width of the line trench 19. Typical values of the step coverage range from about 0.5 to 1, although lesser step coverage is also known. In general, chemical vapor deposition processes tend to provide higher step coverage than physical vapor deposition.

A metal layer is deposited on the lower metallic liner 20 and planarized to form a line-level metal portion 30, the entirety of which is of integral construction, i.e., physically connected. The metal layer may be formed by electroplating, electroless plating, physical vapor deposition (PVD, i.e., sputtering), chemical vapor deposition, or a combination thereof. For example, the metal layer may be formed by physical vapor deposition of a thin seed layer containing a metal and electroplating of the same metal. The metal layer may comprise copper, tungsten, aluminum, gold, or silver. Typically, the metal layer comprises copper. The metal layer is formed directly on the lower metallic liner 20.

The thickness of the metal layer is at least equal to the depth d (See FIG. 3A) of the line trench 19. For example, the metal layer may be annealed at a relatively low temperature from about 100° C. to about 200° C. for a duration from about 30 minutes to about 2 hours to promote grain growth, and thereby to lower the resistivity of the metal layer. The process condition of the anneal may be optimized to promote growth of the grains in the metal layer. Typically, grain sizes have a characteristic dimension which is the lesser of the width of the line trench 19 and the thickness of the metal layer. Alternately, other annealing methods for increasing the grain size in the metal layer may be employed.

Excess material of the metal layer above the topmost surface 17 of the lower dielectric material layer 10 is planarized, for example, by chemical mechanical polishing (CMP). The portions of the lower metallic liner 20 above the topmost surface 17 of the lower dielectric material layer 10 are also removed by CMP. Optionally, the portion of the lower metallic liner 20 above the topmost surface 17 of the lower dielectric material layer 10 may be employed as a stopping layer during the removal of the metal layer. In this case, the CMP process may be a two step process in which a first step is a self-stopping process that removes the portion of the metal layer above portion of the lower metallic liner 20 located above the topmost surface 17 of the lower dielectric material layer 10, and a second step is a process that polishes the portion of the lower metallic liner 20 above the topmost surface 17 of the lower dielectric material layer 10.

After the CMP process, the remaining portion of the metal layer and the lower metallic liner 20 are laterally confined within the periphery of the line trench 19 (See FIGS. 3A and 3B). Further, the remaining portion of the metal layer and the lower metallic liner 20 are excluded from the volume of the at least one dielectric material portion 12. The remaining portion of the metal layer constitutes a line-level metal portion 30. The lower metallic liner 20 and the line-level metal portion 30 collectively constitute a metal line that fills the entirety of the line trench 19. If a dual damascene method is employed, the line-level metal portion 30 may include at least one integrally formed conductive via that fills the at least one via cavity 19' (See FIGS. 3A and 3B).

The top surfaces of the remaining structures are substantially coplanar, i.e., at about the same height without vertical protrusions or vertical recesses. Thus, the topmost surface 17 of the lower dielectric material layer 10, the top surfaces of the at least one dielectric material portion 12, the top surfaces of the lower metallic liner 20, and the top surface of the line-level metal portion 30. The lower dielectric material layer 10, the at least one dielectric material portion 12, the lower metallic liner 20, and the line-level metal portion 30 collectively constitute a lower level metal interconnect structure 3, which fills the volume between the topmost surface of the lower dielectric material layer 17 and a bottommost surface of the lower dielectric material layer 17. The metal line (20, 30) and the set of the lower dielectric material layer 10 and the at least one dielectric material portion 12 complimentarily fill the lower level metal interconnect structure 3.

A portion of the lower metallic liner 20 laterally abuts and surrounds the at least one dielectric material portion 12. The portion of the lower metallic liner 20 is laterally abutted and surrounded by the line-level metal portion 30. The sidewalls of the at least one dielectric material portion 12 laterally surround each of the at least one dielectric material portion 12. Each of the at least one dielectric material portion 12 has a top surface that is substantially coplanar with a topmost surface 17 of the lower dielectric material layer 10 and is of integral construction with the lower dielectric material layer 10. The topmost surface of the lower dielectric material layer 10 is substantially coplanar with a top surface of the lower metal liner 20 and the line-level metal portion 30.

Figure 5A:
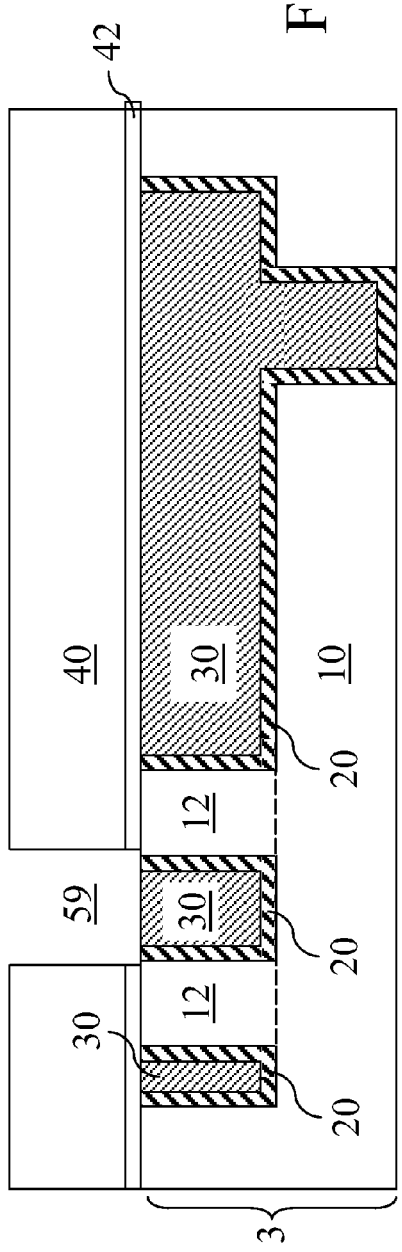
Figure 5B:
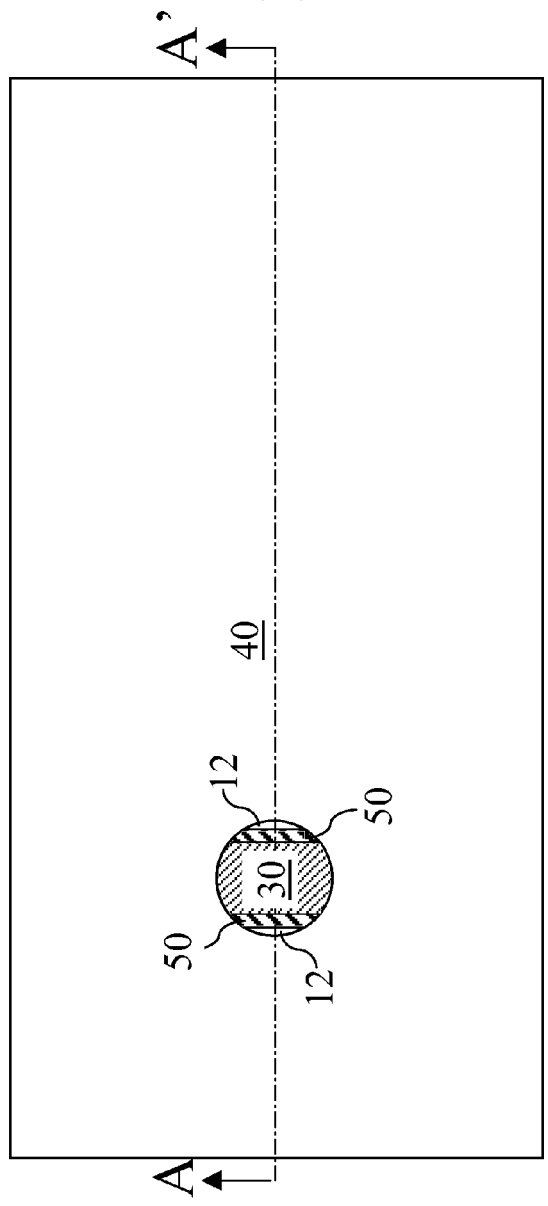

Referring to FIGS. 5A and 5B, an optional dielectric cap layer 42 may be formed directly on the lower level metal interconnect structure 3. An upper dielectric material layer 40 may then be formed directly on the optional dielectric cap layer 42. The optional dielectric cap layer 42 is optional, i.e., may, or may not, be formed. In case an optional dielectric cap layer 42 is not formed, an upper dielectric material layer 40 is formed directly on the lower level metal interconnect structure 3.

The optional dielectric cap layer 42 typically comprises a non-porous dielectric material such as silicon nitride, silicon oxynitride, BLoK™ which is a low-k material containing Si, C, O, and H and formed by plasma enhanced chemical vapor deposition and provided, for example, by Applied Materials Inc.™, or NBLoK™ which is a low-k material containing Si, Co, O, H, and N and formed by plasma enhanced chemical vapor deposition and provided, for example, by Applied Materials Inc.™ The optional dielectric cap layer 42, if present, provides protection of the line-level metal portion 30 from in-diffusion of impurities as well as enhancement of electromigration resistance of the line-level metal portion 30. The thickness of the optional dielectric cap layer 42 may be from about 3 nm to about 90 nm, and typically from about 6 nm to about 40 nm, although lesser and greater thicknesses are also contemplated herein.

The upper dielectric material layer 40 may comprise any material that may be employed for the lower dielectric material layer 10 as described above. The upper dielectric material layer 40 may comprise the same material as, or a different material from, the lower dielectric material layer 10. The thickness of the upper dielectric material layer 40 may be from about 50 nm to about 2 µm, and typically from 100 to about 500 nm, although lesser and greater thicknesses are explicitly contemplated herein.

A via cavity 59 is formed in the upper dielectric material layer 40 and in the optional dielectric cap layer 42 by lithographic methods and an anisotropic etch. For example, a photoresist may be applied over the upper dielectric material layer 40 and lithographically patterned to include a hole in the photoresist. The pattern in the photoresist is transferred into the upper dielectric material layer 40 and the optional dielectric cap layer 42 by vertically recessing the exposed portion, i.e., the patterned area, of the top surface of the upper dielectric material layer 40 to the level of the top surface of the lower level metal interconnect structure 3. The photoresist is subsequently removed selective to the upper dielectric material layer 40. The horizontal cross-sectional area of the via cavity 59 may have a substantially circular shape, any polygonal shape, any elliptical shape, any curvilinear closed shape, or a combination thereof. If a dual damascene method is employed to from the via cavity 59, a line trench may be formed in an upper portion of the upper dielectric material layer 40 by employing another lithography step and another anisotropic etch prior to, or after, the formation of the via cavity 29 as known in the art.

A portion of the line-level metal portion 30 is exposed at the bottom of the via cavity 59. Further, a portion of the lower metallic liner 20, which laterally abuts the at least one dielectric material portion 12, is exposed at the bottom of the via cavity 59. In addition, at least one portion of the top surface(s) of the at least one dielectric material portion 12 may be exposed at the bottom of the via cavity 59. Thus, an upper end of at least one sidewall of the at least one dielectric material portion 12 is exposed at the bottom of the via cavity 59, and an upper end of at least one sidewall of the at least one dielectric material portion 12 may be exposed at the bottom of the via cavity 59.

Figure 6A:
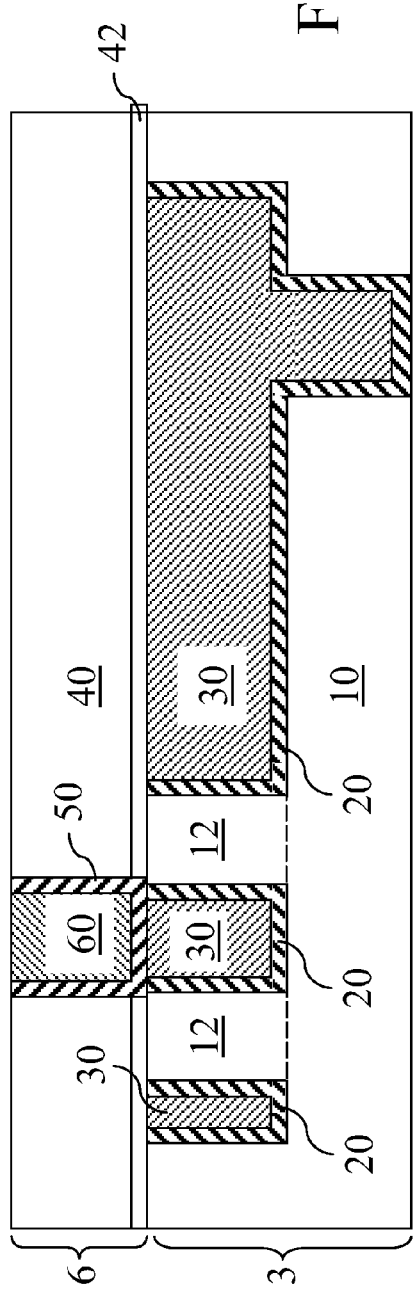
Figure 6B:
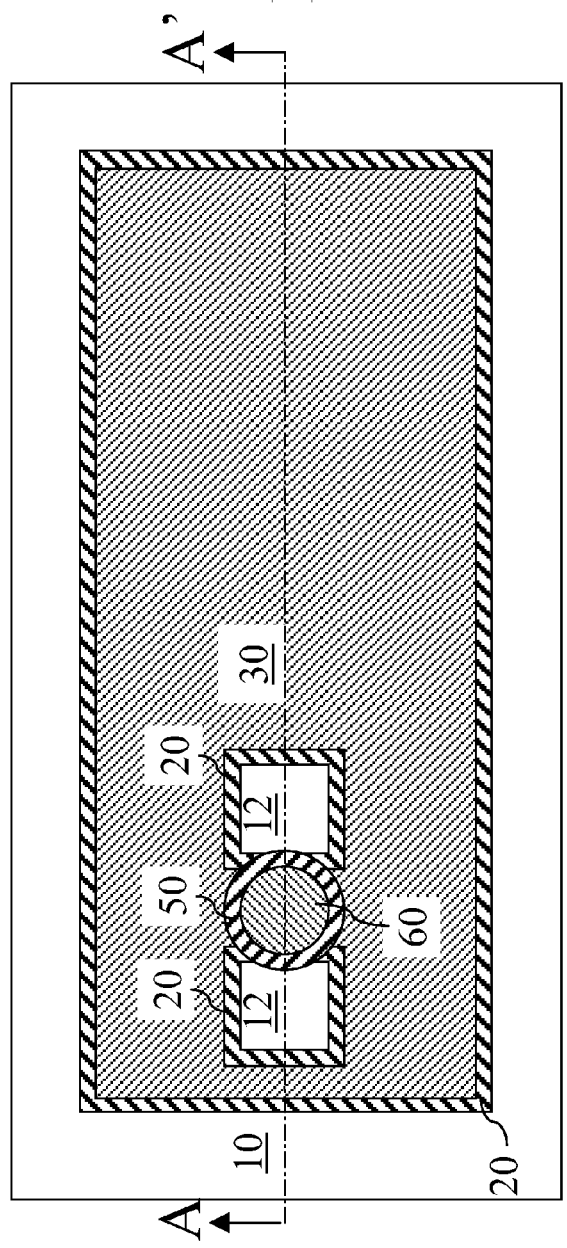

Referring to FIGS. 6A and 6B, a conductive via comprising an upper metallic liner 50 and a via-level metal portion 60 is formed in the via cavity 59. FIG. 6A is a vertical cross-sectional view of the first exemplary metal interconnect structure along the plane A-A' in FIG. 6B. FIG. 6B is a modified top-down view in which an upper dielectric material layer 40 and the optional dielectric cap layer 42 are removed from a top-down view for clarity.

The upper metallic liner 50 is deposited on the sidewalls and the bottom surface of the via cavity 59 by physical vapor deposition (PVD), i.e., sputtering, chemical vapor deposition (CVD), electroplating, electroless plating, or a combination thereof. The upper metallic liner 50 may comprise any material that may be employed for the lower metallic liner 20 as described above. The upper metallic liner 50 may comprise the same material as, or a different material from, the lower metallic liner 20. The material of the upper metallic liner 50 provides higher electromigration resistance than the material of the line-level metal portion 30 and the material of a via-level metal portion to be subsequently formed directly on the upper metallic liner 50.

The upper metallic liner 50 may have the same, or different, thickness between a bottom portion that abut the line-level metal portion 30 and sidewall portions that substantially laterally abut the upper dielectric material layer 40 and the optional dielectric cap layer 42. The bottom portion of the upper metallic liner 50 vertically abuts the line-level metal portion 30 and the top surface of at least one portion of the lower metallic liner 20. The bottom portion of the upper metallic liner 50 may vertically abut a portion of the top surface of the at least one dielectric material portion 20.

The thickness of the bottom portion of the upper metallic liner 50 is herein referred to as the thickness of the upper metallic liner 50. The thickness of the upper metallic liner 50 may be from about 3 nm to about 60 nm, and typically from about 10 nm to about 30 nm, although lesser and greater thicknesses are explicitly contemplated herein.

Another metal layer is deposited on the lower metallic liner and planarized to form a via-level metal portion 60, the entirety of which is embedded in the upper dielectric material layer 40 and the optional dielectric cap layer 42. The metal layer may be formed by electroplating, electroless plating, physical vapor depositon (PVD, i.e., sputtering), chemical vapor deposition, or a combination thereof. For example, the metal layer may be formed by physical vapor deposition of a thin seed layer containing a metal and electroplating of the same metal. The metal layer may comprise copper, tungsten, aluminum, gold, or silver. Typically, the metal layer comprises copper. The metal layer is formed directly on the upper metallic liner 50.

The metal layer fills the entirety of the via cavity 59. For example, the metal layer may be annealed at a relatively low temperature from about 100° C. to about 200° C. for a duration from about 30 minutes to about 2 hours to promote grain growth, and thereby to lower the resistivity of the metal layer. The process condition of the anneal may be optimized to promote growth of the grains in the metal layer. Typically, grain sizes have a characteristic dimension which is the lateral dimension of the via cavity 59. Alternately, other annealing methods for increasing the grain size in the metal layer may be employed.

Excess material of the metal layer above the top surface of the upper dielectric material layer 40 is planarized, for example, by chemical mechanical polishing (CMP). The portions of the upper metallic liner 50 above the top surface of the upper dielectric material layer 40 are also removed by CMP. After the CMP process, the remaining portion of the metal layer and the upper metallic liner 50 are laterally confined within the periphery of the via cavity 59 (See FIGS. 5A and 5B). The remaining portion of the metal layer constitutes a via-level metal portion 60. The upper metallic liner 50 and the via-level metal portion 60 collectively constitute a conductive via that fills the entirety of the via cavity 59. If a dual damascene method is employed, another line-level metal portion (not shown) may be integrally formed with the conductive via (50, 60) in an upper portion of the upper dielectric material layer 40. The stack of the upper dielectric material layer 40 and the optional dielectric cap layer 42 and the conductive via (50, 60) collectively constitute, and complimentarily fill, an upper level metal interconnect structure 6.

The portion of the upper metallic liner 50 which is laterally abutted and surrounded by the line-level metal portion 30 vertically abuts the upper metallic liner 50. The upper metallic liner 50 overlies and vertically abuts the line-level metal portion 30 and a portion of the lower metallic liner 20. The upper metallic liner 50 may overlie and vertically abut a top surface of the at least one dielectric material portion 12.

The lower metallic liner 20 and the upper metallic liner 50 provide a liner-to-liner direct contact. The line-level metal portion 30 and the upper metallic liner 50 provide a liner-to-metal direct contact. While the liner-to-metal direct contact provides a low resistance contact per contact area, the liner-to-metal direct contact is more prone to electromigration. In contrast, the liner-to-liner direct contact provides a higher resistance contact per contact area than the liner-to-metal direct contact, but the liner-to-liner direct contact is less prone, typically virtually immune, to electromigration in typical operational current density ranges. The present invention provides a pair of parallel electrical contacts including a liner-to-metal contact and a liner-to-liner contact to provide both a low resistance contact and an enhanced electromigration resistance.

Many variations of the first exemplary metal interconnect structure may be constructed according to the present invention without impacting the functionality provided by the pair of parallel electrical contacts including a liner-to-metal contact and a liner-to-liner contact. Such variations include, but are not limited to, displacement of the at least one dielectric material portion 12 such as lateral movement and/or rotation around a vertical axis, i.e., an axis perpendicular to the interface between the lower level metal interconnect structure 3 and the upper level metal interconnect structure 6, increase or decrease in the number of the at least one dielectric material portion 12, or a topological variations such as lateral attachment or a lateral detachment of one or more of the at least one dielectric material portion 12 to or from the lower dielectric material layer 10.

The first exemplary metal interconnect structure illustrates an example in which the at least one dielectric material portion 12 comprises two dielectric material portions 12 that are placed along the direction of current flow within the metal line (20, 30). It is noted that the current flows in a horizontal direction within the plane A-A'. The two dielectric material portions are separated by a distance that is less than the dimension of the conductive via (50, 60), i.e., the diameter of the conductive via (50, 60), along the direction of the separation of the two dielectric material portions 12. This arrangement insures that a liner-to-liner contact is present irrespective of overlay variations that may be generated during lithography steps. In other words, the feature of the pair of parallel electrical contacts including a liner-to-metal contact and a liner-to-liner contact is present irrespective of any overlay variation in any lateral direction, thereby stabilizing the electromigration-resistive properties of the first exemplary metal interconnect structure.

Figure 7A:
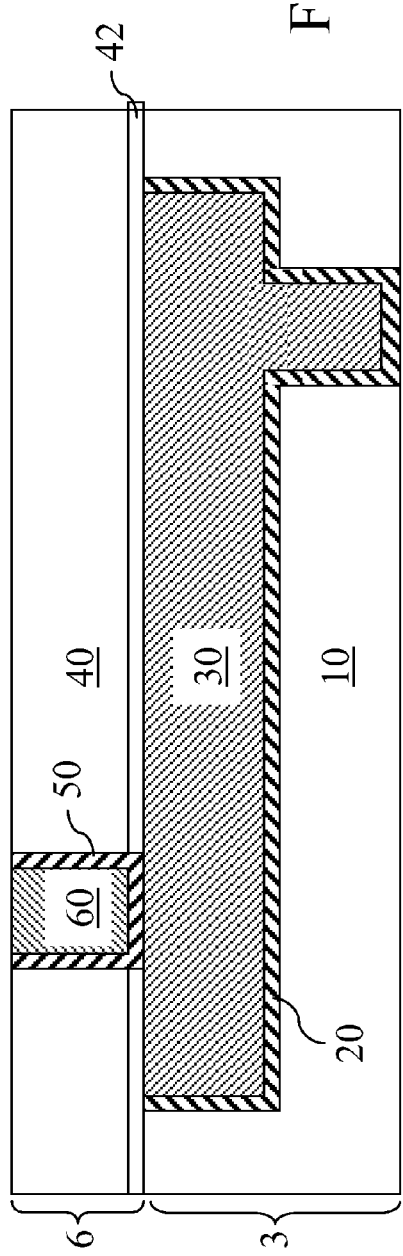
FIG. 7A is a vertical cross-sectional view along the plane A-A' of FIG. 7B of a second exemplary metal interconnect structure according to a second embodiment of the present invention.
Figure 7B:
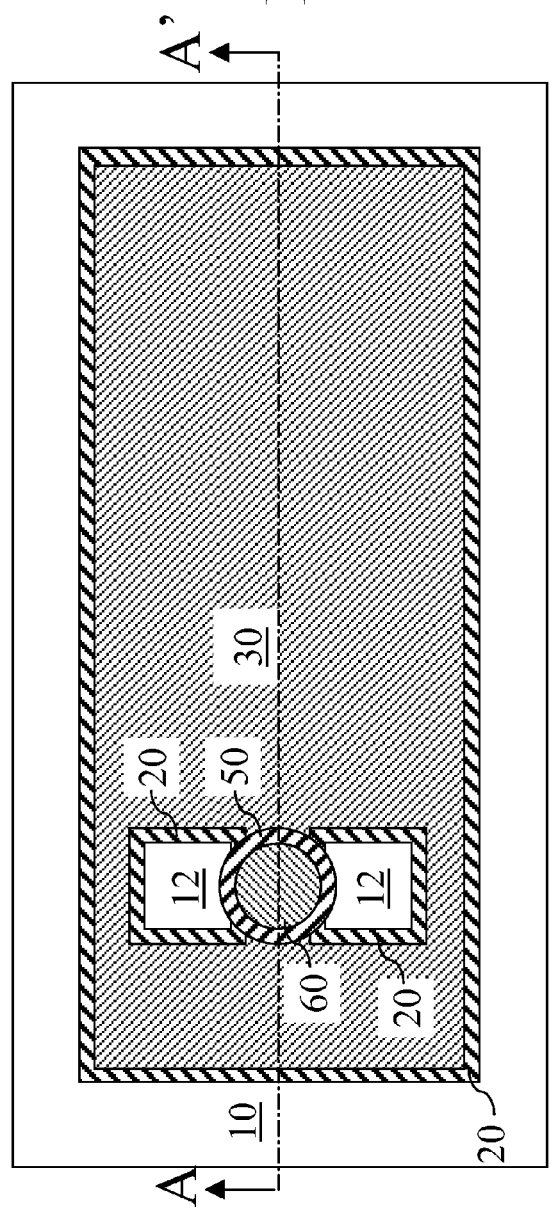
FIG. 7B is a modified top-down view of the second exemplary metal interconnect structure of FIG. 7A in which an upper dielectric material layer 40 and an optional dielectric cap layer 42 are removed from a top-down view for clarity.

Referring to FIGS. 7A and 7B, a second exemplary metal interconnect structure according to a second embodiment of the present invention may be formed by employing the same processing methods as in the first embodiment with a modification in the placement of the at least one dielectric material portion 12. FIG. 7A is a vertical cross-sectional view along the plane A-A' in FIG. 7B. FIG. 7B is a modified top-down view of the second exemplary metal interconnect structure of FIG. 7A in which an upper dielectric material layer 40 and the optional dielectric cap layer 42 are removed from a top-down view for clarity.

Specifically, the second exemplary semiconductor structure is formed by placing two dielectric material portions 12 in a direction perpendicular to the direction of the current flow in the metal line (20, 30). The feature of the pair of parallel electrical contacts including a liner-to-metal contact and a liner-to-liner contact is preserved under lithographic overlay variation between the metal line (20, 30) and the conductive via (50, 60) in any direction.

Figure 8:
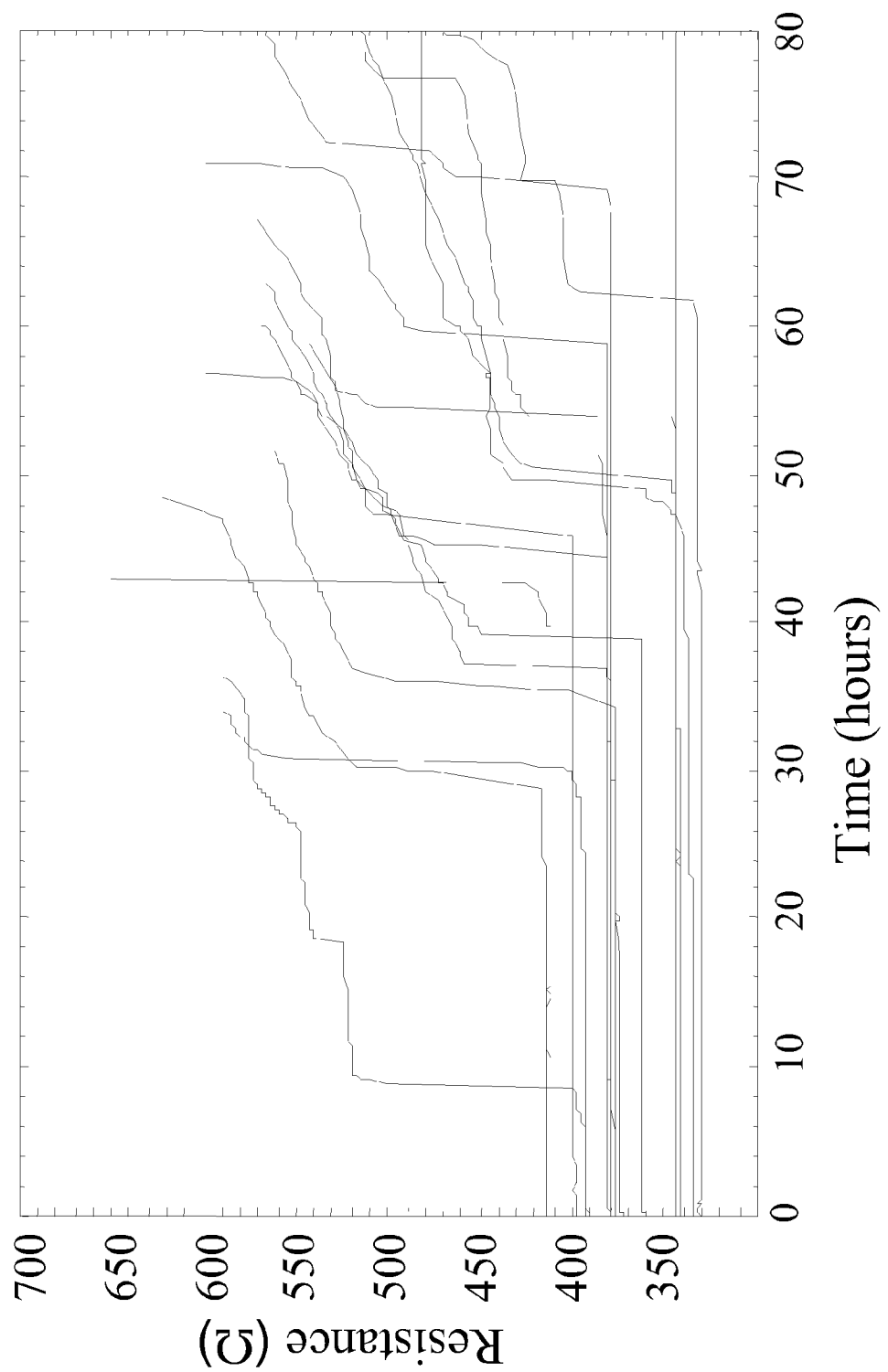
FIG. 8 is a graph showing data for resistance shift in time for a group of physical interconnect structures employing the second exemplary metal interconnect structure of the present invention in FIGS. 7A and 7B.

FIG. 8 is a graph showing data for resistance shift in time for a group of physical interconnect structures employing the second exemplary metal interconnect structure of the present invention in FIGS. 7A and 7B. The resistance of each physical interconnect structure, or each "sample," according to the second embodiment of the present invention was monitored and plotted as a function of time in FIG. 8. The samples according to the present invention has identical physical features as the prior art samples employed to generate the graph in FIG. 2 except for the introduction of the inventive features into the physical structure according to the second embodiment of the present invention. Identical stress conditions were employed to stress the samples of FIG. 8 as the samples of FIG. 2. The only difference between the two groups of samples between FIG. 2 and FIG. 8 is that the second exemplary metal interconnect structure of FIGS. 7A and 7B was employed for samples characterized in FIG. 8 instead of the exemplary prior art metal interconnect structure of FIGS. 1A and 1B that was employed for samples characterized in FIG. 2.

The samples according to the present invention demonstrate a longer failure time in general. Here, resistance shift above 600 Ohms is considered to be a failure. Data in FIG. 8 shows clustered failures exceeding 50 hours. The increase of the resistance of the samples typically starts after about 30 hours. Further, the resistance of the samples increases gradually. The relatively slow rate of increase in resistance with after an indication of the beginning of electromigration failure is believed to be due to the liner-to-liner contact which provides an alternative conductive path even when voids are formed at the interface between the upper metallic liner and the line-level metal portion. Thus, the present invention provides enhanced electromigration resistance compared to the exemplary prior art structure of FIGS. 1A and 1B and other similar prior art structures.

Figure 9A:
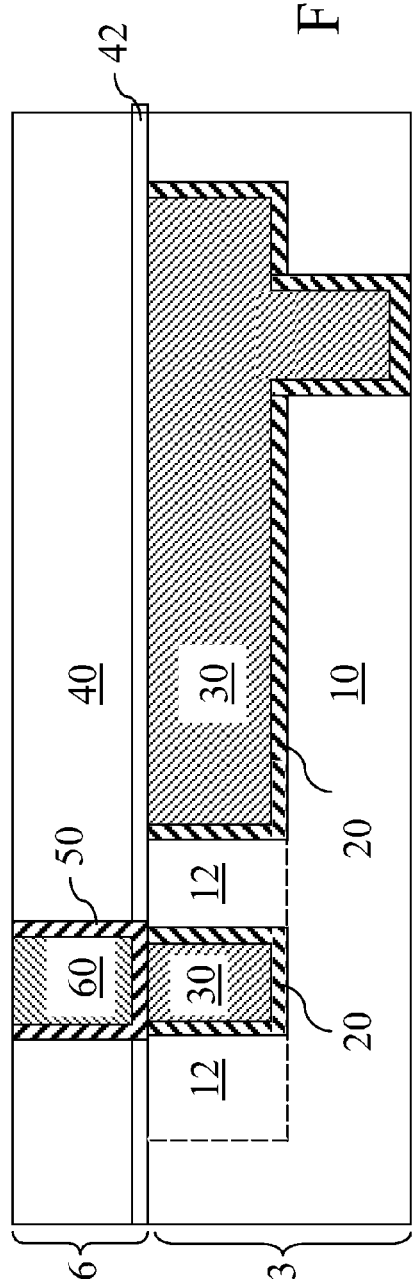
FIG. 9A is a vertical cross-sectional view along the plane A-A' of FIG. 9B of a third exemplary metal interconnect structure according to a third embodiment of the present invention.
Figure 9B:
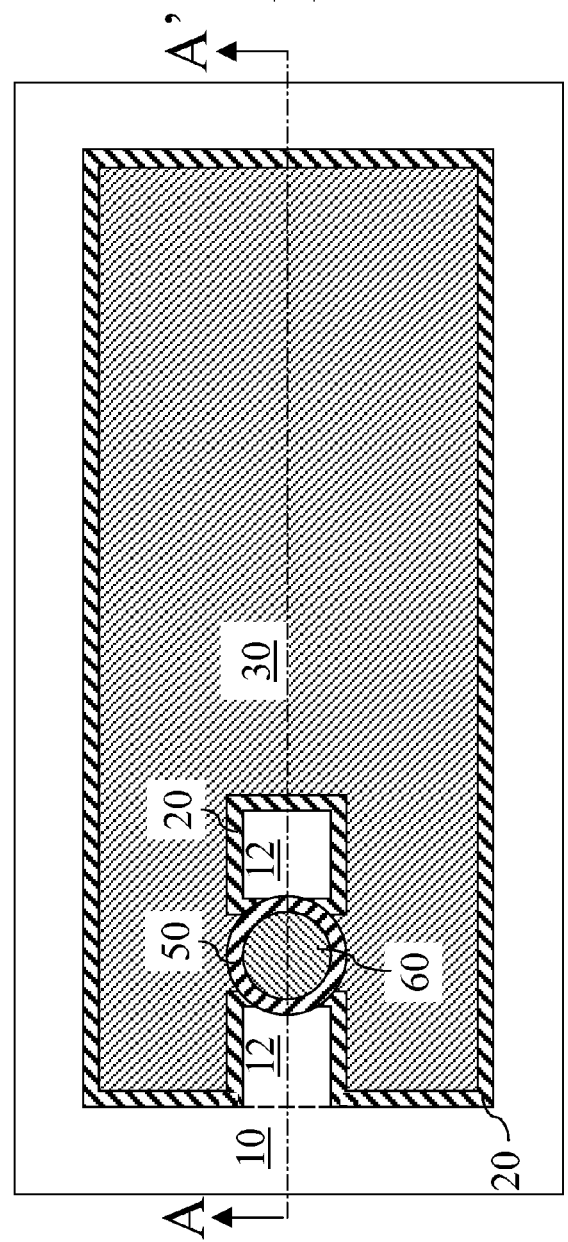
FIG. 9B is a modified top-down view of the second exemplary metal interconnect structure of FIG. 9A in which an upper dielectric material layer 40 and an optional dielectric cap layer 42 are removed from a top-down view for clarity.

Referring to FIGS. 9A and 9B, a third exemplary metal interconnect structure according to a third embodiment of the present invention may be formed by employing the same processing methods as in the first embodiment with a modification in the placement of the at least one dielectric material portion 12 and/or placement of the conductive via (50, 60). FIG. 9A is a vertical cross-sectional view along the plane A-A' in FIG. 9B. FIG. 9B is a modified top-down view of the second exemplary metal interconnect structure of FIG. 9A in which an upper dielectric material layer 40 and the optional dielectric cap layer 42 are removed from a top-down view for clarity.

Specifically, the third exemplary semiconductor structure is formed by inducing a topological variation on the first exemplary semiconductor structure by placing the two dielectric material portions 12 closer to an edge of the metal line (20, 30). Thus, one of the two dielectric material portion 12 is no longer laterally isolated from the lower dielectric material layer 10, but laterally abuts the lower dielectric material layer 10. The feature of the pair of parallel electrical contacts including a liner-to-metal contact and a liner-to-liner contact is preserved under lithographic overlay variation between the metal line (20, 30) and the conductive via (50, 60) in any direction.

In the third exemplary semiconductor structure, one of the at least one dielectric material portion 12 is of integral construction with, and laterally abuts, the lower dielectric material layer 10. This dielectric material portion 12 also vertically abuts the lower dielectric material layer 10. The boundary, which is not a physical interface but an artificially drawn boundary, between this dielectric material portion 12 and the lower dielectric material layer 10 is shown as a vertical dotted line and a horizontal dotted line in FIG. 9A and as another dotted line in FIG. 9B. A sidewall of the lower metallic liner 20 is laterally recessed away from the lower dielectric material layer 10 toward the conductive via (50, 60). A portion of the lower metallic liner 20 laterally abuts this dielectric material portion 20 and vertically abuts the upper metallic liner 50.

Figure 10:
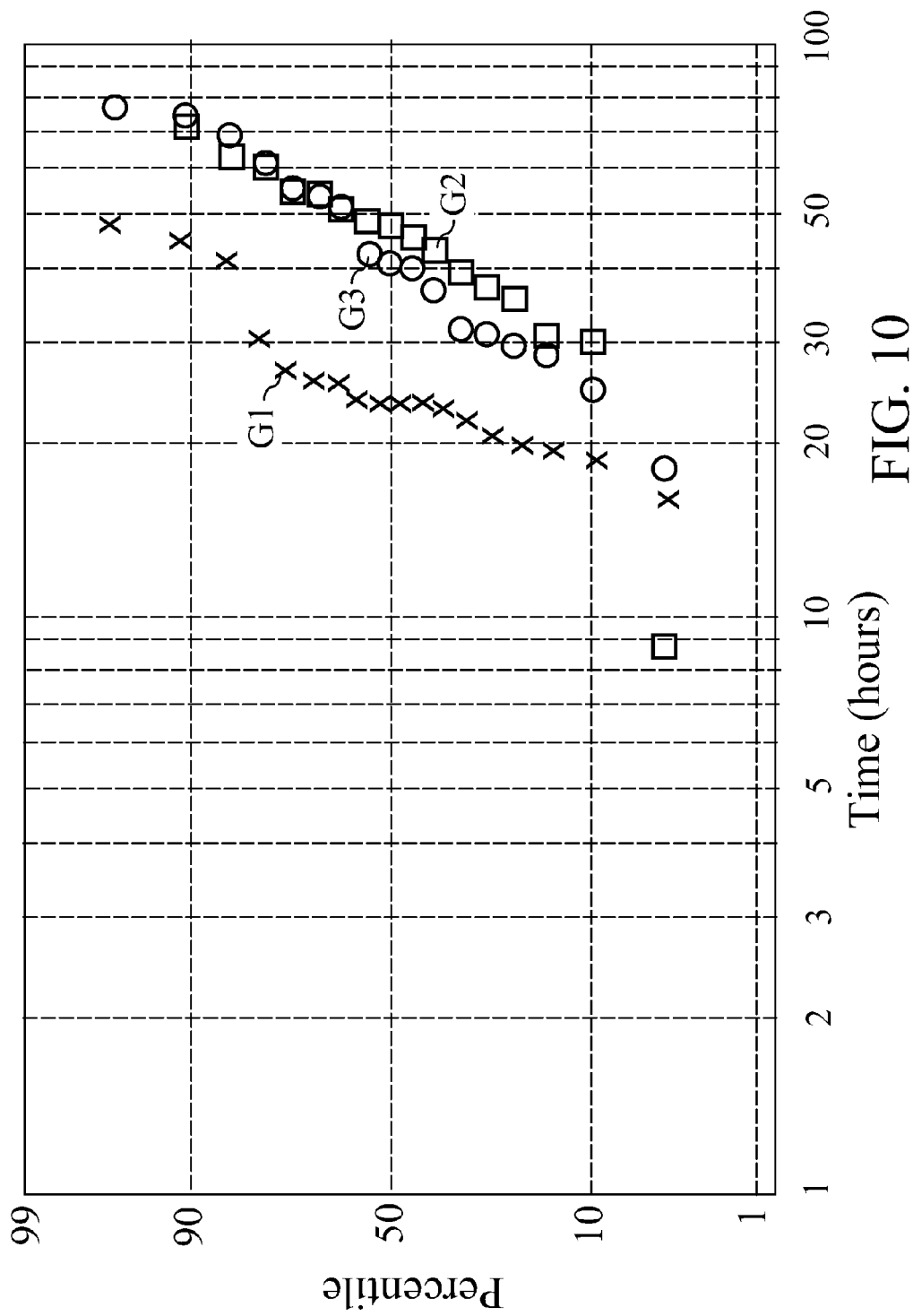
FIG. 10 is a graph of shows the failure time distribution for three groups of physical interconnect structures including a first group G1 according to the prior art and a second group G2 and a third group G3 according to the second and third embodiments, respectively, of the present invention.

FIG. 10 is a failure percentile plot that shows the failure time distribution for three groups of physical interconnect structures. A first group G1 of data points represents the failure time distribution for tested physical interconnect structures employing the exemplary prior art metal interconnect structure of FIGS. 1A and 1B. A second group G2 of data points represents the failure time distribution for tested physical interconnect structures employing the second exemplary metal interconnect structure of FIGS. 7A and 7B of the present invention. A third group G3 of data points represents the failure time distribution for tested physical interconnect structures employing the third exemplary metal interconnect structure of FIGS. 9A and 9B of the present invention.

The data set in FIG. 2 for the exemplary prior art metal interconnect structure is summarized as the first group G1 of data points that are marked with x's. The data set in FIG. 8 for the second exemplary metal interconnect structure according the second embodiment of the present invention is summarized as the second group G2 of data points that are marked with squares. A corresponding data set for the third exemplary metal interconnect structure according to the third embodiment of the present invention is summarized as the third group G3 of data points that are marked with open circles. Both the second and third groups (G2, G3) of data points demonstrate enhanced electromigration performance over the first group G1 of data points based on prior art structures in terms of mean time for electromigration failure.

Further variations of the first through third exemplary metal interconnect structures are explicitly contemplated. Referring to FIGS. 11A and 11B, a fourth exemplary metal interconnect structure according to a fourth embodiment of the present invention may be formed by employing the same processing methods as in the first embodiment with a modification in the placement of the at least one dielectric material portion 12. Specifically, the at least one dielectric material portion 12 comprises two dielectric material portions that rotated around the vertical axis intercepting the conductive via (50, 60) by an arbitrary azimuthal rotation angle. The cross-sectional area of each of the at least one dielectric material portion 12, as seen in the modified top-down view of FIG. 11, may be any closed shape as discussed above.

Figure 12A:
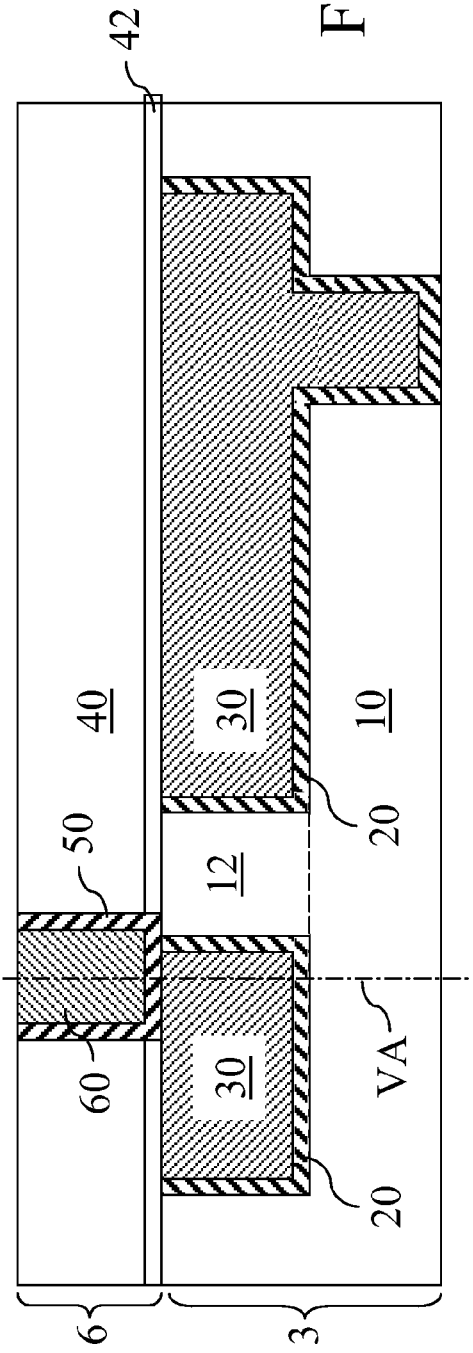
Figure 12B:
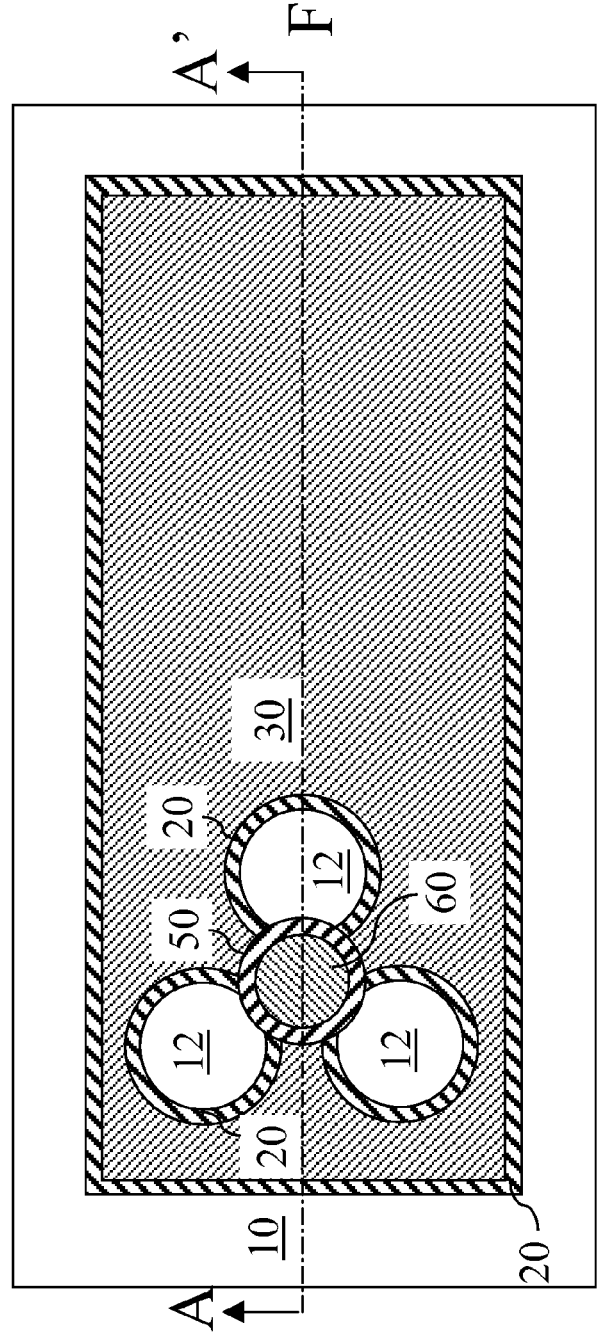

Referring to FIGS. 12A and 12B, a fifth exemplary metal interconnect structure according to a fifth embodiment of the present invention may be formed by employing the same processing methods as in the first embodiment with a modification in the number and the placement of the at least one dielectric material portion 12. Specifically, the at least one dielectric material portion 12 comprises three dielectric material portions that are arranged around the conductive via (50, 60).

In general, when the at least one dielectric material portion 12 comprises a plurality of dielectric material portions, the plurality of dielectric material portions may have an n-fold rotational symmetry around a vertical axis that is substantially perpendicular to a planar interface between the lower level metal interconnect structure 3 and the upper level metal interconnect structure 6. The number n is an integer greater than 1, i.e., 2, 3, 4, 5, 6, etc. In this case, the vertical axis preferably intercepts the conductive via (50, 60). In some cases, the vertical axis may be the same as a vertical center axis of the conductive via (50, 60) for geometric configurations for the conductive via (50, 60) that has the vertical center axis of rotational symmetry or mirror symmetry. Preferably, a distance from the vertical axis to each of the plurality of dielectric material portions is less than a lateral dimension of the conductive via (50, 60) such as a diameter. This type of configuration insures that a liner-to-liner contact is maintained irrespective of any overlay variations between the at least one dielectric material portions 12 and the conductive vias (50, 60).

Figure 13A:
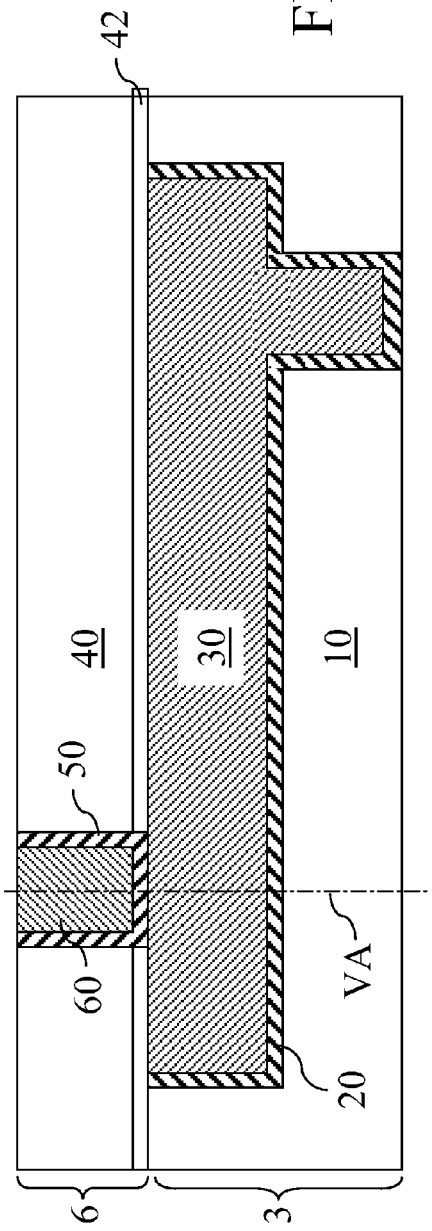
Figure 13B:
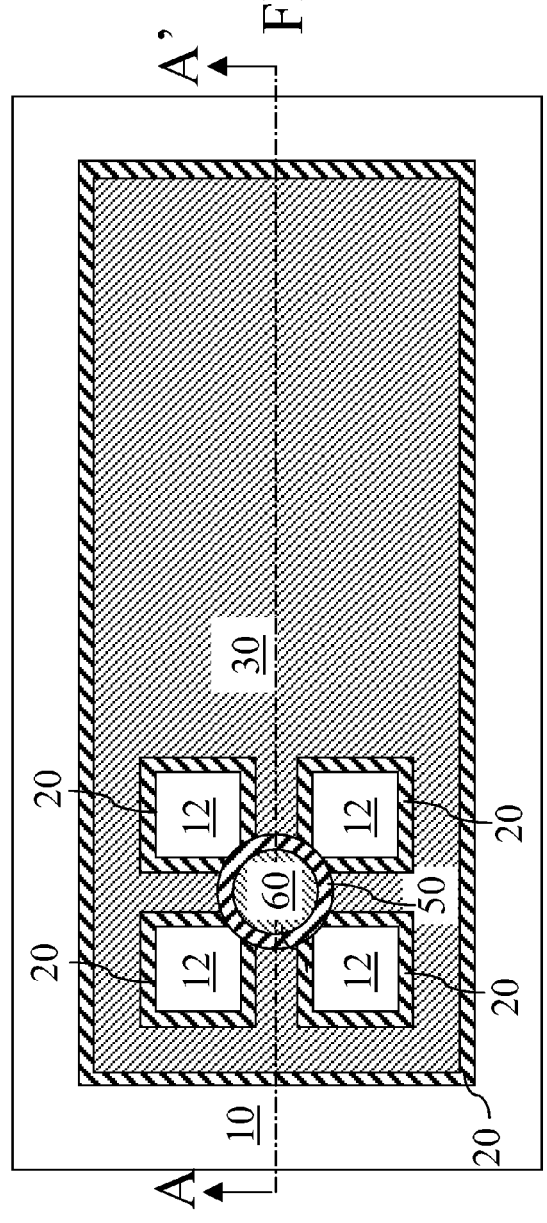

Referring to FIGS. 13A and 13B, a sixth exemplary metal interconnect structure according to a sixth embodiment of the present invention may be formed by employing the same processing methods as in the first embodiment with a modification in the number and the placement of the at least one dielectric material portion 12. Specifically, the at least one dielectric material portion 12 comprises four dielectric material portions that are arranged around the conductive via (50, 60).

Figure 14A:
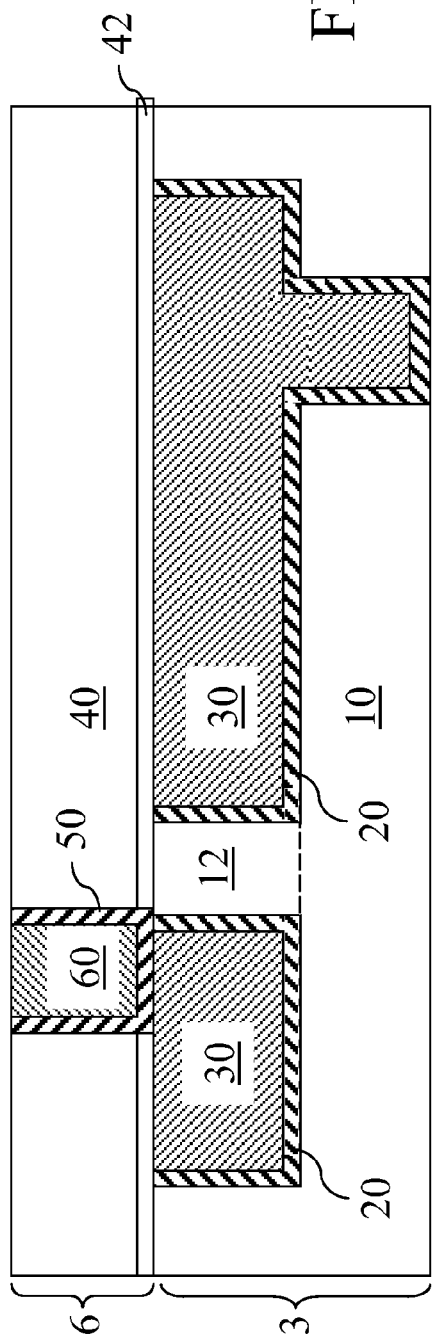
Figure 14B:
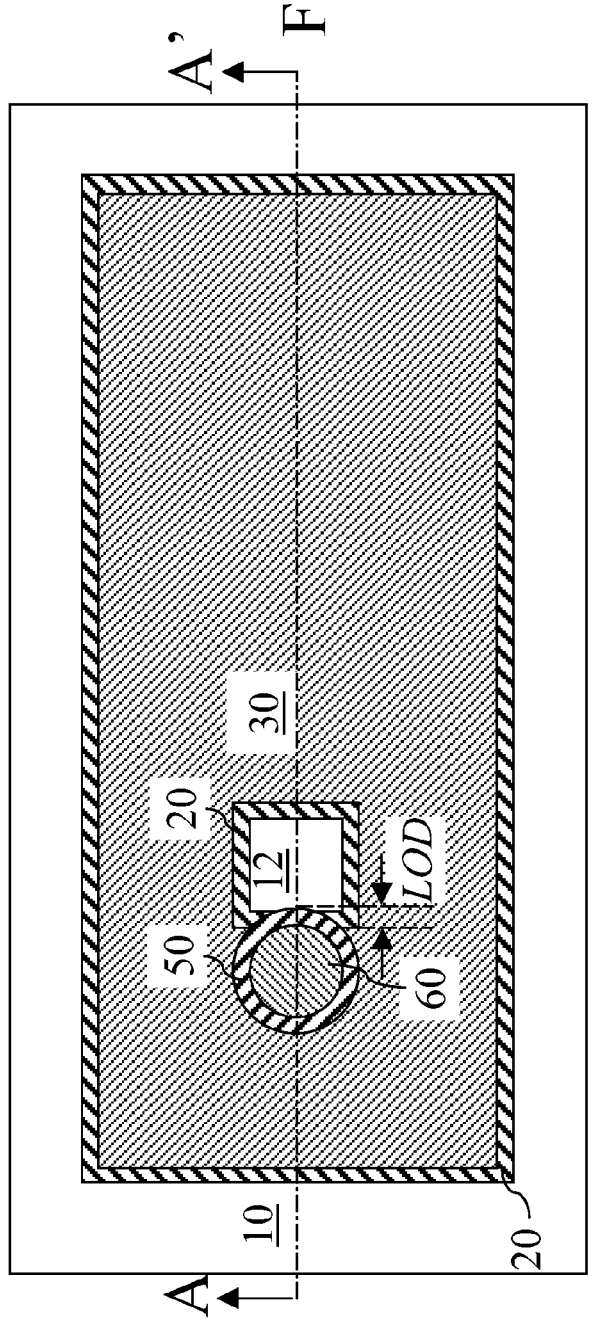

Referring to FIGS. 14A and 14B, a seventh exemplary metal interconnect structure according to a seventh embodiment of the present invention may be formed by employing the same processing methods as in the first embodiment with a modification in the number and the placement of the at least one dielectric material portion 12. Specifically, the at least one dielectric material portion 12 comprises a single dielectric material portion 12 that are located in the front side of the current path from the conductive via (50, 60). The seventh exemplary metal interconnect structure may be derived from the first exemplary metal interconnect structure by elimination a dielectric material portion 12 located in the back side of the current path.

The maximum distance in the direction connecting the center of mass of the horizontal cross-sectional shape of the conductive via (50, 60) and the center of mass of the cross-sectional shape of the dielectric material portion 12 within the overlap area of the two cross-sectional areas is herein referred to as a lateral overlap distance LOD, which is a measure of the overlay tolerance of the seventh exemplary metal interconnect structure for maintaining a liner-to-liner contact between the upper metallic liner 50 and the lower metallic liner 20. According to the seventh embodiment, the lateral overlap distance LOD is designed to be greater than maximum lateral overlay variation between the dielectric material portion 12 and the conductive via (50, 60), thereby ensuring the liner-to-liner contact is maintained despite overlay variations during a manufacturing process.

Figure 16A:
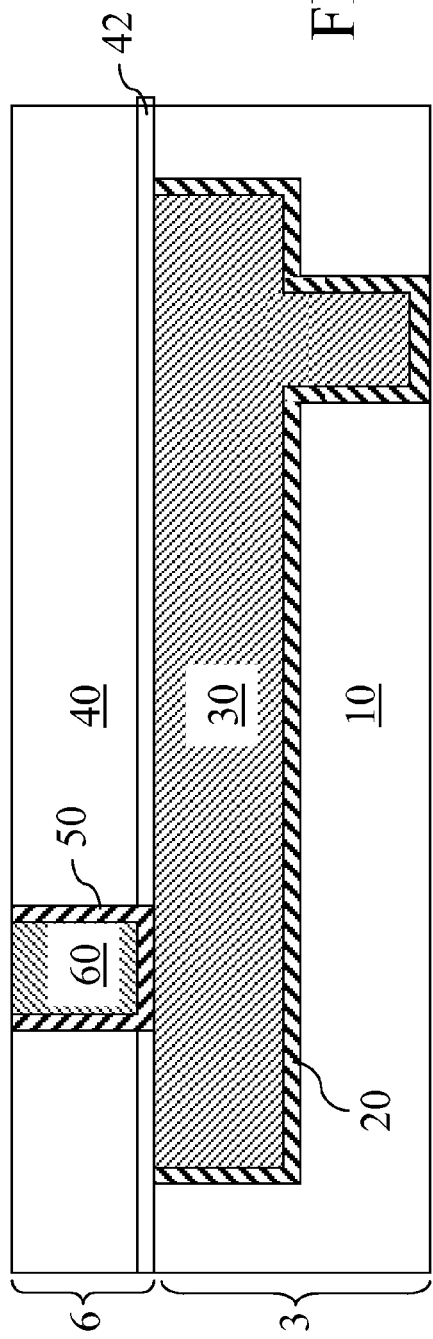
Figure 16B:
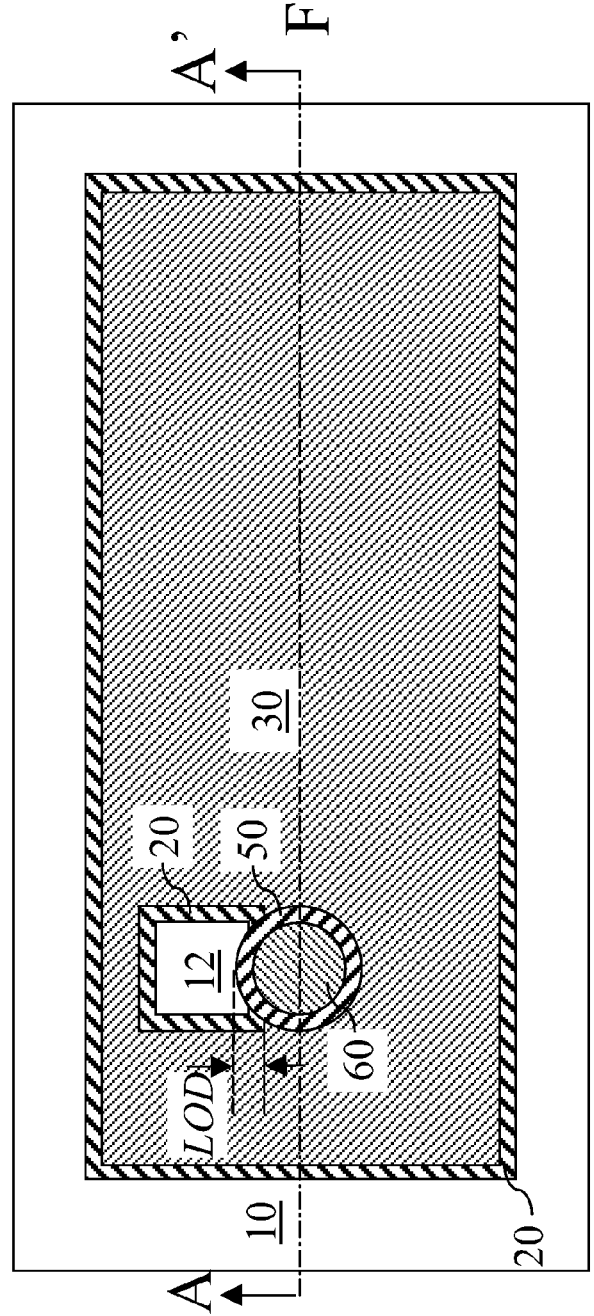

The current path from the conductive via (50, 60) is in a horizontal direction in the plane of A-A'. The dielectric material portion may be located to the side of the direction of the current path, as illustrated in an eighth exemplary metal interconnect structure shown in FIGS. 15A and 15B according to an eighth embodiment of the present invention, or in the back side of the current path, as illustrated in a ninth exemplary metal interconnect structure shown in FIGS. 16A and 16B according to a ninth embodiment of the present invention. In general, the dielectric material portion 12 may be located in any azimuthal orientation relative to the current path of from or to the conductive via (50, 60). Further, the dielectric material portion 12 may have any cross-sectional shape as the at least one dielectric material portion 12 as discussed above. When only one dielectric material portion is employed as in the seventh through ninth embodiments and variations therefrom, the lateral overlap distance LOD is designed to be greater than maximum lateral overlay variation between the dielectric material portion 12 and the conductive via (50, 60) to ensure that the liner-to-liner contact is maintained despite overlay variations during a manufacturing process.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of manufacturing a metal interconnect structure comprising:

forming a line trench and at least one dielectric material portion by vertically recessing a patterned area of a lower dielectric material layer, and wherein sidewalls of said at least one dielectric material portion laterally surround said at least one dielectric material portion or a sidewall of said at least one dielectric material portion laterally protrudes into said line trench;

forming ling a metal line including a lower metal liner that contacts sidewalls of said line trench and a line-level metal portion that is spaced from said sidewalls of said trench by said lower metal liner in said line trench;

forming an upper dielectric material layer on said metal line; and forming a conductive via in said upper dielectric material layer, wherein said lower metallic liner directly contacts said upper metallic liner.

2. The method of claim 1, wherein said at least one dielectric material portion has a top surface that is substantially coplanar with a topmost surface of said lower dielectric material layer and is of integral construction with said lower dielectric material layer, wherein sidewalls of said at least one dielectric material portion constitute a portion of sidewalls of said line trench, and wherein said topmost surface of said lower dielectric material layer is substantially coplanar with a top surface of said lower metal liner and said line-level metal portion.

3. The method of claim 2, further comprising forming a via cavity in said upper dielectric material layer, wherein a portion of said lower metallic liner is exposed at a bottom of said via cavity.

4. The method of claim 3, wherein said at least one dielectric material portion is exposed at said bottom of said via cavity.

5. The method of claim 1, wherein said at least one dielectric material portion is of integral construction with, and vertically contacts, said lower dielectric material layer, wherein a portion of said lower metallic liner laterally contacts and surrounds said at least one dielectric material portion, wherein said portion of said lower metallic liner is laterally contacted and surrounded by said line-level metal portion and vertically contacts said upper metallic liner.

6. The method of claim 1, wherein said at least one dielectric material portion is of integral construction with, and laterally contacts, said lower dielectric material layer, wherein a sidewall of said lower metallic liner is laterally recessed away from said lower dielectric material layer toward said conductive via, and wherein a portion of said lower metallic liner laterally contacts said at least one dielectric material portion and vertically contacts said upper metallic liner.

7. The method of claim 1, wherein said at least one dielectric material portion comprises a plurality of dielectric material portions of integral construction with, and vertically contacting, said lower dielectric material layer, wherein at least one portion of said lower metallic liner laterally contacts one of said plurality of dielectric material portions and vertically abuts said upper metallic liner.

8. A method of manufacturing a metal interconnect structure comprising:

forming a line trench in a lower dielectric material layer by vertically recessing a patterned area of said lower dielectric material layer, wherein at least one portion of said lower dielectric material layer is not recessed during said vertical recessing so as to form at least one dielectric material portion that is laterally surrounded by said line trench;

forming a metal line including a lower metal liner and a line-level metal portion in said line trench;

forming an upper dielectric material layer on said metal line; and forming a conductive via in said upper dielectric material layer, wherein said lower metallic liner directly contacts said upper metallic liner.

9. The method of claim 8, wherein said at least one dielectric material portion has a top surface that is substantially coplanar with a topmost surface of said lower dielectric material layer and is of integral construction with said lower dielectric material layer, wherein sidewalls of said at least one dielectric material portion constitute a portion of sidewalls of said line trench, and wherein said topmost surface of said lower dielectric material layer is substantially coplanar with a top surface of said lower metal liner and said line-level metal portion.

10. The method of claim 9, further comprising forming a via cavity in said upper dielectric material layer, wherein a portion of said lower metallic liner is exposed at a bottom of said via cavity.

11. The method of claim 10, wherein said at least one dielectric material portion is exposed at said bottom of said via cavity.

12. The method of claim 8, wherein said at least one dielectric material portion is of integral construction with, and vertically abuts, said lower dielectric material layer, wherein a portion of said lower metallic liner laterally abuts and surrounds said at least one dielectric material portion, wherein said portion of said lower metallic liner is laterally abutted and surrounded by said line-level metal portion and vertically abuts said upper metallic liner.

13. The method of claim 8, wherein said at least one dielectric material portion is of integral construction with, and laterally abuts, said lower dielectric material layer, wherein a sidewall of said lower metallic liner is laterally recessed away from said lower dielectric material layer toward said conductive via, and wherein a portion of said lower metallic liner laterally abuts said at least one dielectric material portion and vertically abuts said upper metallic liner.

14. The method of claim 8, wherein said at least one dielectric material portion comprises a plurality of dielectric material portions of integral construction with, and vertically abutting, said lower dielectric material layer, wherein at least one portion of said lower metallic liner laterally abuts one of said plurality of dielectric material portions and vertically abuts said upper metallic liner.

15. The method of claim 8, wherein said lower metal liner contacts sidewalls of said line trench and said line-level metal portion is spaced from said sidewalls of said trench by said lower metal liner in said line trench.

16. A method of manufacturing a metal interconnect structure comprising:

forming a line trench and at least one dielectric material portion by vertically recessing a patterned area of a lower dielectric material layer, and wherein sidewalls of said at least one dielectric material portion laterally surround said at least one dielectric material portion;

forming a metal line including a lower metal liner that contacts sidewalls of said line trench and a line-level metal portion that is spaced from said sidewalls of said trench by said lower metal liner in said line trench;

forming an upper dielectric material layer on said metal line; and forming a conductive via in said upper dielectric material layer, wherein said lower metallic liner directly contacts said upper metallic liner.

17. The method of claim 16, wherein said at least one dielectric material portion has a top surface that is substantially coplanar with a topmost surface of said lower dielectric material layer and is of integral construction with said lower dielectric material layer, wherein sidewalls of said at least one dielectric material portion constitute a portion of sidewalls of said line trench, and wherein said topmost surface of said lower dielectric material layer is substantially coplanar with a top surface of said lower metal liner and said line-level metal portion.

18. The method of claim 16, wherein said at least one dielectric material portion is of integral construction with, and vertically abuts, said lower dielectric material layer, wherein a portion of said lower metallic liner laterally abuts and surrounds said at least one dielectric material portion, wherein said portion of said lower metallic liner is laterally abutted and surrounded by said line-level metal portion and vertically abuts said upper metallic liner.

19. The method of claim 16, wherein said at least one dielectric material portion is of integral construction with, and laterally abuts, said lower dielectric material layer, wherein a sidewall of said lower metallic liner is laterally recessed away from said lower dielectric material layer toward said conductive via, and wherein a portion of said lower metallic liner laterally abuts said at least one dielectric material portion and vertically abuts said upper metallic liner.

20. The method of claim 16, wherein said at least one dielectric material portion comprises a plurality of dielectric material portions of integral construction with, and vertically abutting, said lower dielectric material layer, wherein at least one portion of said lower metallic liner laterally abuts one of said plurality of dielectric material portions and vertically abuts said upper metallic liner.

* * * * *